United States Patent
Hasegawa et al.

(10) Patent No.: US 6,757,962 B2
(45) Date of Patent: Jul. 6, 2004

(54) METHOD FOR MANUFACTURING EXCHANGE BIAS TYPE MAGNETIC FIELD SENSING ELEMENT

(75) Inventors: Naoya Hasegawa, Niigata-ken (JP);
Eiji Umetsu, Niigata-ken (JP);
Masamichi Saito, Niigata-ken (JP);
Kenichi Tanaka, Niigata-ken (JP);
Yosuke Ide, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 403 days.

(21) Appl. No.: 10/013,242

(22) Filed: Dec. 10, 2001

(65) Prior Publication Data

US 2002/0069511 A1 Jun. 13, 2002

(30) Foreign Application Priority Data

Dec. 11, 2000 (JP) ........................................ 2000-375862
Apr. 24, 2001 (JP) ........................................ 2001-125619

(51) Int. Cl.$^7$ .......................... H04R 31/00; G11B 5/127
(52) U.S. Cl. ................. 29/603.14; 29/603.07; 29/603.08; 29/603.12; 29/603.15; 29/603.16; 427/127; 427/128; 360/324.11; 360/324.12
(58) Field of Search .......................... 29/603.07, 603.08, 29/603.12, 2, 603.16; 360/324.11, 324.12; 427/127, 128

(56) References Cited

U.S. PATENT DOCUMENTS

| | | | |
|---|---|---|---|
| 5,932,097 A | * | 8/1999 | Wilson ........................ 210/222 |
| 5,949,623 A | | 9/1999 | Lin ............................. 430/314 |
| 6,030,753 A | | 2/2000 | Lin ............................. 360/113 |
| 6,413,325 B1 | * | 7/2002 | Shimazawa et al. ........ 148/108 |
| 6,424,506 B1 | * | 7/2002 | Saito et al. ............. 360/324.11 |
| 6,517,896 B1 | * | 2/2003 | Horng et al. ................ 427/123 |

FOREIGN PATENT DOCUMENTS

JP  11243240 A * 9/1999 ........... H01L/43/12

OTHER PUBLICATIONS

"D.C. magnetic field measurements based on the inverse Wiedemann effect in Fe–rich glass covered amorphous wires"; Chiria H.; Hristoforou, E.; Neagu, M.; Darie, I.; Barariu, F.; Sept. 1999; pps. 3625–3627.*
"A Compass Using a Thin Magnetic Film Component"; Castro, P.; Component Parts, IEEE Transactions on, vol. 11, Issu 2, Jun. 1964; pp. 19–26.*

* cited by examiner

Primary Examiner—A. Dexter Tugbang
Assistant Examiner—Paul Kim
(74) Attorney, Agent, or Firm—Brinks Hofer Gilson & Lione

(57) ABSTRACT

In a method for manufacturing a magnetic field sensing element including an electrode layer overlying a second antiferrogmagnetic layer and a first free magnetic layer where the electrode layer exposes a portion of the second magnetic layer, a portion of the second antiferromagnetic layer not covered with the electrode layer and a portion of the first free magnetic layer are removed using the electrode layer as a mask after laminating each layer to form a bottom type spin-valve thin film magnetic element, thereby enabling the first free magnetic layer to be endowed with a sufficient exchange coupling magnetic field by substantially eliminating the tapered portion of the remaining second antiferromagnetic layer thereby enabling the magnetization of the second free magnetic layer to be put into a single domain state.

11 Claims, 12 Drawing Sheets

US 6,757,962 B2

METHOD FOR MANUFACTURING EXCHANGE BIAS TYPE MAGNETIC FIELD SENSING ELEMENT

BACKGROUND OF THE INVENTION

1. Field of the Invention

The present invention relates to a magnetic field sensing element whose electrical resistance changes in relation to the direction of magnetization of a free magnetic layer that is affected by both the direction of pinned magnetization of a pinned magnetic layer and an external magnetic field. The present invention more particularly relates to a method for manufacturing a magnetic field sensing element that is able to increase a longitudinal bias magnetic field and allows magnetization of the free magnetic layer to align in a direction for appropriately intersecting magnetization of the free magnetic layer.

2. Description of the Related Art

A magnetoresistive magnetic field sensing element is categorized as an AMR (Anisotropic Magnetoresistive) head when it includes an element that exhibits a magnetoresistive effect, and a GMR (Giant Magnetoresistive) head when it includes an element that exhibits a giant magnetoresistive effect. The AMR head has a monolayer structure in which the element exhibiting the magnetoresistive effect is composed of a magnetic material. The GMR head has, on the other hand, is a multilayer structure in which the element includes a plurality of laminated materials. While the giant magetoresistance effect can be generated by several different structures, a spin-valve type thin film magnetic element is commonly used because it has a high rate of change of magnetoresistivity against a weak external magnetic field.

FIG. 15 is a cross sectional view of our exemplary conventional spin-valve type thin film magnetic element as seen from the side facing a recording medium.

The spin-valve type thin film magnetic element shown in FIG. 15 is a so-called bottom type single spin-valve type thin film magnetic element that includes one layer each of an antiferromagnetic layer, pinned magnetic layer, non-magnetic layer and free magnetic layer.

The spin-valve type thin film magnetic element shown in FIG. 15 is composed of, from the bottom to the top, an underlayer 6, an antiferromagnetic layer 1, a pinned magnetic layer 2, a non-magnetic layer 3, a multilayer film 9 composed of a free magnetic layer 4 and protective layer 7, a pair of hard bias layers (permanent magnetic layers) 5 formed on both side faces of the multilayer film 9, and a pair of electrode layers 8 formed on hard bias layers 5. A track width Tw is determined by the width on the surface of the multilayer film 9.

Usually, a Fe—Mn or Ni—Mn alloy film is used for the antiferromagnetic layer 1, a Ni—Fe alloy film is used for the pinned magnetic layer 2 and free magnetic layer 4, a Cu film is used for the non-magnetic layer 3, a Co—Pt film is used for the hard bias layers 5, a Cr or W film is used for the electrode layers 8, and a Ta film is used for the underlayer 6 and protective layer 7.

As shown in FIG. 15, the pinned magnetic layer 2 is magnetized as a single magnetic domain in the Y-direction (the direction of a leak magnetic field from a recording medium: height direction) by an exchange coupling magnetic field with the antiferromagnetic layer 1, and magnetization of the free magnetic layer 4 is aligned in the X-direction (track width direction) under the affect of the bias magnetic field from the hard bias layers 5.

In other words, magnetization of the pinned magnetic layer 2 and magnetization of the free magnetic layer 4 are adjusted to be approximately perpendicular to each other.

A sense current flows from the electrode layers 8 to the pinned magnetic layer 2, non-magnetic layer 3 and free magnetic layer 4 in this spin-valve type thin film magnetic element. The direction of magnetization of the free magnetic layer 4 changes from the X-direction to the Y-direction when the leaking magnetic field from the recording medium is applied in the Y-direction. Electrical resistance changes in relation to the variation of the magnetization direction in the free magnetic layer 4 and the direction of pinned magnetization of the pinned magnetic layer 2 (referred to as a magnetoresistive effect). The leaking magnetic field from the recording medium is sensed by voltage changes based on this changes of electrical resistance.

The spin-valve type thin film magnetic element as shown in FIG. 15 is however, incompatible with high density recording. While magnetization of the pinned magnetic layer 2 is fixed in the Y-direction as a single magnetic domain, as described above, the hard bias layers 5, magnetized in the X-direction, are provided at both sides of the pinned magnetic layer 2. Consequently, magnetization at each side edge of the pinned magnetic layer 2 is particularly affected by the bias magnetic field from the hard bias layers 5, thereby making it difficult to fix the direction of magnetization in the Y-direction.

Accordingly, the direction of magnetization of the free magnetic layer 4, being in a single magnetic domain state by the influence of magnetization of the hard bias layers 5 in the X-direction, and the direction of magnetization of the pinned magnetic layer 2 is not perpendicular in the vicinity of the side edges of the multilayer film 9. Furthermore, magnetization in the vicinity of the side edges of the free magnetic layer 4 is fixed by the strong magnetization from the hard bias layers 5 and is likely to be insensitive to the external magnetic field. As a result, a dead zone having a poor regenerative sensitivity is formed in the vicinity of the side edges of the multilayer film 9.

Although the central portion of the multilayer film 9 substantially contributes to regeneration of the recording medium so as to serve as a sensitive zone manifesting the magnetoresistive effect (a practical track width), it has been difficult to accurately determine the width of the sensitive zone due to irregularity of the dead zone. Therefore, it also becomes difficult to properly comply with narrowing of the track width for high density recording that will be required in the near future.

FIG. 16 shows an improved spin-valve type thin film magnetic element provided for solving the foregoing problems. FIG. 16 also shows a manufacturing process thereof. The same reference numerals as in FIG. 15 denote the same layers.

A part of each side 4a of the free magnetic layer 4 is removed in this spin-valve type thin film magnetic element, and an ferromagnetic layer 13 is formed at each removed part. Second antiferromagnetic layers 10, and electrodes 8 are continuously deposited on the ferromagnetic layers 13 using a lift-off resist 12. The second antiferromagnetic layer 10 is made of an antiferromagnetic material. The ferromagnetic layer 13 is made of, for example, a NiFe alloy film.

In the spin-valve type thin film magnetic element shown in FIG. 16, a longitudinal bias magnetic field is applied by a so-called exchange bias method. An exchange coupling magnetic field is generated between the second antiferromagnetic layer 10 and ferromagnetic layer 13 by the exchange bias method. Accordingly, the longitudinal bias magnetic field in the X-direction is applied to the free magnetic layer 4 by a ferromagnetic coupling between the ferromagnetic layer 13 and free magnetic layer 4.

Use of the exchange bias method can eliminate the dead zone as seen in the spin-valve type thin film magnetic element shown in FIG. 15. Accordingly, the track width can be accurately and easily determined for high density recording that will be required in the near future.

The spin-valve type thin film magnetic element as shown in FIG. 16, however, also has the following problems. Since the tip portions 10*a* and 10*a* of the second antiferromagnetic layers 10, deposited by using the lift-off resist layer 12, are tapered, as shown in FIG. 16, the exchange coupling magnetic field generated between each tip portion 10*a* and ferromagnetic layer 13 becomes extremely small. Particularly, the exchange coupling magnetic field is not generated at all when the thickness of the tip portion 10*a* is smaller than 50 Å. Accordingly, a sufficient longitudinal bias magnetic field is not supplied to the free magnetic layer 4 in the region located under the tapered tip portion 10*a*. Thus, the free magnetic layer 4 lying under the track width Tw can only be put into the single magnetic domain state owing to the weak bias magnetic field, causing with great difficulty the generation of Barkhausen noise. In addition, magnetization at each side edge of the free magnetic layer 4, formed under the tip portion 10*a*, is readily fluctuated since it is not strongly pinned in the track width direction, thereby arising a side-reading problem.

In the method for controlling magnetization of the free magnetic layer 4 by the exchange bias method, the exchange coupling magnetic field is generated in two steps. First, an exchange coupling magnetic field is generated between the first antiferromagnetic layer 1 and pinned magnetic layer 2 and, second, another exchange coupling magnetic field is generated between the second antiferromagnetic layer 10 and ferromagnetic layer 13. Consequently, magnetization of the pinned magnetic layer 2 and magnetization of the free magnetic layer 4 cannot be directed so as to intersect with each other, unless the heat treatment temperature, and the magnitude and direction of the applied magnetic field are properly adjusted.

SUMMARY OF THE INVENTION

Accordingly, it is an object of the present invention to provide a method for manufacturing a magnetic field sensing element that is able to generate a large longitudinal bias magnetic field by eliminating tapered tip portions of the second antiferromagnetic layer, so as to properly direct magnetization of the free magnetic layer and magnetization of the pinned magnetic layer in a direction to intersect with each other.

Accordingly, the present invention provides a method for manufacturing a magnetic field sensing element comprising the following steps.

(a) A laminate is formed by sequentially laminating a first antiferromagnetic layer, a pinned magnetic layer, a non-magnetic layer, a free magnetic layer comprising a first free magnetic layer, a non-magnetic intermediate layer and a second free-magnetic layer laminated in this order from the bottom, and a second antiferromagnetic layer.

(b) An exchange coupling magnetic field is generated between the first and second antiferromagnetic layers by applying a heat treatment at a first heat treatment temperature, while applying a first magnetic field to the laminate in the direction perpendicular to a track width direction. As a result, the direction of magnetization of the pinned magnetic layer and the direction of magnetization of the free magnetic layer are fixed in the perpendicular direction with each other, while allowing the exchange coupling magnetic field of the first antiferromagnetic layer to be larger than the exchange coupling magnetic field of the second antiferromagnetic layer.

(c) The element is heat treated at a second heat treatment temperature higher than the first heat treatment temperature, while applying, a second magnetic field in the track width direction, that is larger than the exchange coupling magnetic field of the second antiferromagnetic layer in step (b), and smaller than the exchange coupling magnetic field of the first antiferromagnetic layer. As a result, the free magnetic layer is endowed with a longitudinal bias magnetic field in a direction that intersects the direction of magnetization of the pinned magnetic layer.

(d) A pair of electrode layers are formed on the laminate at a given distance apart from each other.

(e) Finally, the laminate, exposed between a pair of the electrodes, is removed up to midway of the second free magnetic layer.

In the present invention a so-called ferrimagnetic structure is formed by inserting the non-magnetic intermediate layer between the two free magnetic layers in step (a). The ferrimagnetic structure comprises antiparallel orientations of magnetization of the first free magnetic layer and second free magnetic layer. The magnetization may be made more stabilized by forming the ferrimagnetic structure.

According to the method described above, a portion of the second antiferromagnetic layer not covered with the electrode layer, as well as a part of the free magnetic layer, are removed using the electrode formed in the step (d) as a mask. This manufacturing method permits the tip portion of the second antiferromagnetic layer to be less tapered as compared with an antiferromagnetic layer manufactured by the conventional method. Further, by forming the free magnetic layer as a ferromagnetic structure, a sufficient longitudinal bias magnetic field to be supplied from the second antiferromagnetic layer to the free magnetic layer. Consequently, the free magnetic layer can be properly put into a single magnetic domain state to suppress side reading.

According to the present invention, the track width may be narrowed, while facilitating the single magnetic domain structure of the free magnetic layer in response to the high density recording expected in the near future. Furthermore, a magnetic field sensing element is provided that is able to properly suppress Barkhausen noise.

The directions of magnetization of the free magnetic layer and pinned magnetic layer can be adjusted so as to intersect with each other by methods (b) and (c) in the present invention.

In step (b), an exchange coupling magnetic field is generated in the first antiferromagnetic layer and second antiferromagnetic layer by applying a heat treatment at a first heat treatment temperature, in order to fix the directions of magnetization of the first antiferromagnetic layer and second antiferromagnetic layer in the direction of a first applied magnetic field applied (the height direction). The magnitude of the exchange coupling magnetic field of the first antiferromagnetic layer is adjusted to be higher than the exchange coupling magnetic field of the second antiferromagnetic layer. This relation between the intensities described above can be attained by forming a so-called bottom type spin-valve type thin film magnetic element structure in which the first antiferromagnetic layer is formed under the second antiferromagnetic layer, or by appropriately adjusting the composition ratio of the first antiferromagnetic layer.

In step (c), a second magnetic field, which is larger than the exchange coupling magnetic field of the second antiferromagnetic layer in step (b) and smaller than the exchange coupling magnetic field of the first antiferromagnetic layer, is applied in the track width direction. The heat treatment temperature (the second heat treatment temperature) is adjusted to be higher than the first heat treatment temperature.

Magnetization of the pinned magnetic layer is not changed in this step, because the magnitude of the second magnetic field is smaller than the exchange coupling magnetic field of the first antiferromagnetic layer in step (b), and remains to be fixed in the direction (height direction) perpendicular to the track width direction.

Magnetization of the free magnetic layer fluctuates, on the other hand, in the track width direction with the direction of the applied magnetic field, since the magnitude of the second magnetic field is larger than the exchange coupling magnetic field of the second antiferromagnetic layer in step (b). Magnetization of the free magnetic layer is properly aligned in the track width direction due to the generated exchange coupling magnetic field from the second antiferromagnetic layer that is larger than that generated in step (b) as a result of a higher heat treatment temperature than the first heat treatment temperature.

According to the method for manufacturing the magnetic field sensing element in the present invention, the tip portion of the second antiferromagnetic layer is less tapered than the conventional ones, and a large longitudinal bias magnetic field is supplied to the free magnetic layer by forming the free magnetic layer to have a ferrimagnetic structure to facilitate the single magnetic domain structure of the free magnetic layer, thereby enabling magnetization of the free magnetic layer to be adjusted to properly intersect magnetization of the pinned magnetic layer.

The spin-valve type thin film magnetic element is manufactured by forming a laminate comprising the first antiferromagnetic layer, pinned magnetic layer, non-magnetic layer, free magnetic layer and second antiferromagnetic layer on a substrate, followed by heat treating the laminate. Therefore, the surface of each layer formed between the substrate and second antiferromagnetic layer never contacts ambient air when forming the laminate. Accordingly, cleaning by ion milling and inverse sputtering of a surface is not required, as is the case when the surface contacts ambient air. Accordingly, the magnetic field sensing element can be easily manufactured with good reproducibility. Furthermore, eliminating the need of cleaning of the surface of each layer by ion milling or inverse sputtering provides an excellent manufacturing method free from troubles arising from the cleaning process, such as contamination by re-adsorption, and adverse effects on generation of the exchange coupling magnetic field due to distortion of surface crystallinity.

A pair of the electrodes to be formed in step (d) may be formed on the second antiferromagnetic layer in step (a), and step (e) may be applied next to step (c) in the present invention.

It is preferable in the present invention to form the electrodes using a lift-off resist layer. The magnetic field sensing element compatible with narrowing the track width for high density recording may be manufactured by properly adjusting the dimension of the track width formed on the lower face of the lift-off resist layer.

The laminate may be removed up to midway of the non-magnetic layer in step (e) in the present invention. Eliminating the laminate permits a large longitudinal bias magnetic field to be applied to the free magnetic layer having a ferrimagnetic structure located under the second ferromagnetic layer to allow the free magnetic layer to be in a single magnetic domain state. In addition, the non-magnetic intermediate layer serves as a back layer, and can acquire large $\Delta$MR (magnetoresistivity), enabling a magnetic field sensing element to be compatible with the high density recording expected in the near future.

The first antiferromagnetic layer and the second antiferromagnetic layer are preferably formed using an antiferromagnetic material containing Mn and at least one element comprising Pt, Pd, Rh, Ru, Ir, Os, Au, Ag, Cr, Ni, Ne, Ar, Xe and Kr in the present invention.

In the present invention, a CoFeNi alloy is used for at least one and, preferably, both the first and second free magnetic layers in order to improve the material for the first and second free magnetic layers, and to increase an antiparallel coupling force between the first and second free magnetic layers. Consequently, the side edges of the first and second free magnetic layers, located at both sides in the track width direction, are prevented from fluctuating against the external magnetic field. This properly suppresses side-reading through a synergetic effect of an exchange coupling magnetic field acting between the first antiferromagnetic layer and second free magnetic layer. Including Co in the CoFeNi alloy enhances the antiparallel coupling force.

When the laminate comprises a film lamination structure of non-magnetic layer/first free magnetic layer/non-magnetic intermediate layer/second free magnetic layer, the CoFeNi alloy preferably comprises about 9 at % to about 17 at % of Fe and about 0.5 at % to about 10 at % of Ni, with a balance of Co. It is preferred that the Fe content not be larger than about 17 at %, since magnetic distortion becomes larger than $-3 \times 10^{-6}$ and soft magnetic properties are deteriorated. It is also preferred that the Fe content not be less than about 9 at % since magnetic distortion becomes larger than $3 \times 10^{-6}$, which also causes deterioration of the soft magnetic properties. It is also preferred that the Ni content not be larger than about 10 at %, since magnetic distortion becomes larger than $3 \times 10^{-6}$, while causing decrease of magnetoresistance ($\Delta$R) and magnetoresistivity ($\Delta$R/R) due to diffusion of Ni between the non-magnetic layer and free magnetic layers.

It is preferred that the Ni content not be smaller than about 0.5 at % since the magnetic distortion shifts to the negative side from $-3 \times 10^{-6}$.

A coercive force of 790 (A/m) or less may be obtained within the composition range described above.

When the laminate film comprises non-magnetic layer/intermediate layer (a CoFe alloy)/first free magnetic layer/non-magnetic intermediate layer/free magnetic layer, it is also preferable in the present invention that the CoFeNi alloy comprises about 7 at % to about 15 at % of Fe, and about 5 at % to about 15 at % of Ni with a balance of Co. It is preferred that the Fe content not be larger than about 15 at % since magnetic distortion shifts to negative side from $-3 \times 10^{-6}$ to deteriorate soft magnetic properties. It is also preferred that the Fe content not be smaller than about 7 at % since magnetic distortion becomes larger than $3 \times 10^{-6}$, which causes deterioration of the soft magnetic properties. It is also preferred that the Ni content not be larger than about 15 at % since magnetic distortion becomes larger than $3 \times 10^{-6}$. It is also preferred that the Ni content not be smaller than about 5 at % since magnetic distortion shifts to negative side from $-3 \times 10^{-6}$.

A coercive force of about 790 (A/m) or less may be obtained within the composition range described above.

The Fe content is slightly decreased and Ni content is slightly increased in the CoFeNi alloy as compared with the film construction in which the intermediate layer is not inserted between the first free magnetic layer and non-magnetic layer, since the intermediate layer comprising CoFe or Co has negative magnetic distortion.

The film construction in which the intermediate layer comprising CoFe alloy or Co is inserted between the non-magnetic layer and first free magnetic layer is preferable since diffusion of metallic element between the first free magnetic layer and non-magnetic layer can be more effectively prevented.

It is preferable in the present invention that both the first and second free magnetic layers are formed of the CoFeNi alloy.

The heat treatment temperature in steps (b) and (c), and the preferable composition ranges of the first and second antiferromagnetic layers will be described hereinafter.

In the present invention the first heat treatment temperature is about 220° C. to about 245° C., and the second treatment temperature is preferably about 250° C. to about 270° C.

In the present invention, m, representing the composition ratio, is preferably in the range of about 46 at %≦m≦about 53.5 at %, when the antiferromagnetic layer comprises an alloy represented by $X_m Mn_{100-m}$, where X in the formula is at least one element from the group Pt, Pd, Ir, Rh, Ru and Os.

It is preferred that the composition ratio m not be less than about 46 at % or more than about 53.5 at %, since the exchange coupling magnetic field becomes smaller than $1.58 \times 10^4$ A/m even after the first heat treatment at a heat treatment temperature of about 245° C. This is because the crystal lattice of the X-Mn alloy is hardly arranged as a L10 type ordered lattice and will fail in manifesting antiferromagnetic properties, or will fail in generating a unidirectional exchange coupling magnetic field.

An exchange coupling magnetic field of about $3.16 \times 10^4$ A/m may be obtained after the second heat treatment at a heat treatment temperature of about 270° C. in the composition range as described above.

The preferable composition ratio m of the X-Mn alloy is within the range of about 48.5 at % to about 52.7 at %, because in this composition range, an exchange coupling magnetic field of more than about $4.74 \times 10^4$ A/m may be obtained after the first heat treatment at a heat treatment temperature of about 245° C.

In one embodiment, the antiferromagnetic layer of the bottom type spin-valve type thin film magnetic element is represented by $Pt_m Mn_{100-m-n} Z_n$, where Z is at least one element from the group of Pd, Ir, Rh, Ru and Os. The subscripts m and n indicate the composition ratio and are preferably in the range of about 46 at %≦m+n≦about 53.5 at % and about 0.2 at %≦n≦about 40 at %. In this composition range, an exchange coupling magnetic field of about $1.58 \times 10^4$ A/m may be obtained by the first heat treatment at a heat treatment temperature of about 245° C. The preferable range of the composition ratio m+n is about 48.5 at % to about 52.7 at %.

It is preferred that n not be less than about 0.2 at % since ordering of the crystal lattice of the antiferromagnetic layer is not enhanced, or an effect for increasing the exchange coupling magnetic field is not fully exhibited. It is also preferred that n not exceeding about 40 at % because the exchange coupling magnetic field decreases.

In another embodiment, the antiferromagnetic layer of the bottom type spin-valve type thin film magnetic element is represented by $Pt_q Mn_{100-q-j} L_j$, where L is at least one element from the group of Au, Ag, Cr, Ni, Ne, Ar, Xe and Kr. The subscripts q and j represent the composition ratios are preferably in the ranges of about 46 at %≦q+j≦about 53.5 at % and about 0.2 at %≦j≦about 10 at %.

It is preferred that the ratio q+j not be less than about 46 at % nor more than about 53.5 at %, since the exchange coupling magnetic field becomes $1.58 \times 10^4$ A/m or less even after the first heat treatment at a heat treatment temperature of about 245° C. More preferably the range of q+j is 48.5 at % to about 52.7.

It is preferred that j not be less than about 0.2 at % because the uniaxial exchange magnetic coupling magnetic field is not fully manifested by adding the element L, while if the ratio j exceeds about 10 at % the uniaxial exchange magnetic coupling magnetic field decreases.

When the antiferromagnetic layer of the top type spin-valve type thin film magnetic element includes an alloy represented by $X_m Mn_{100-m}$, where X is at least one element from the group of Pt, Pd, Ir, Rh, Ru and Os)$_m$ representing the composition ratio and is preferably in the range of about 49 at %≦m≦about 55.5 at %.

It is preferred that m not be less than about 49 at % nor more than about 55.5 at %, since the exchange coupling magnetic field becomes $1.58 \times 10^4$ A/m even after the second heat treatment at a second heat treatment temperature of about 270° C. This is because the crystal lattice of the X-Mn alloy is not arranged as a L10 type ordered lattice will fail in exhibiting antiferromagnetic properties, or will fail in manifesting the uniaxial exchange coupling magnetic field.

It is evident that the antiferromagnetic layer of the top type spin-valve type thin film magnetic element has a lower exchange coupling magnetic field than the antiferromagnetic layer of the bottom type spin-valve type thin film magnetic element in either composition ratio in the range described above, when the element is heat treated, for example, at about 245° C. In other words, the exchange coupling magnetic field of the antiferromagnetic layer of the bottom type element can be made higher than that of the antiferromagnetic field of the top type element even after the first heat treatment.

The more preferable range of the ratio m is about 49.5 at % to about 54.5 at %, because an exchange coupling magnetic field about of $3.16 \times 10^4$ A/m can be obtained by a heat treatment at about 270° C. The exchange coupling magnetic field of the antiferromagnetic layer of the bottom type element becomes larger than that of the antiferromagnetic layer of the top type element by applying a heat treatment at about 245° C.

In one embodiment, the antiferromagnetic layer of the top type spin-valve type thin film magnetic element is represented by $Pt_m Mn_{100-m-n} Z_n$, where z is at least one element from the group of Pd, Ir, Rh, Ru and Os and m and n, representing the composition ratios, are preferably in the range of about 49 at %≦m+n≦about 55.5 at % and about 0.2 at %≦n≦about 40 at %.

It is preferred that the composition ratio m+n not exceed about 55.5 at % since the exchange coupling magnetic field becomes $1.58 \times 10^4$ A/m or less. More preferably the ratio m+n is about 49.5 at % to about 54.5 at %.

It is also preferred that the ratio n not be less than about 0.2 at %, since ordering the crystal lattice of the antiferromagnetic field is not enhanced, or increasing the exchange coupling magnetic field is not fully manifested. It is also preferred that the ratio n not exceed about 40 at %, because the exchange coupling magnetic field decreases.

In another embodiment, the antiferromagnetic layer of the top type spin-valve type thin film magnetic element is represented by $Pt_qMn_{100-q-j}L_j$, where L is at least one element from the group Au, Ag, Cr, Ni, Ne, Ar, Xe and Kr. The subscripts q and j represent the composition ratio and are preferably in the ranges of about 49 at $\% \leq q+j \leq$ about 55.5 at % and about 0.2 at $\% \leq j \leq$ about 10 at %.

It is preferred that the ratio q+j not be less than about 49 at % nor more than about 55.5 at % since the exchange coupling magnetic field becomes $1.58 \times 10^4$ A/m or less even by applying the second heat treatment at a heat treatment temperature of about 270° C. The preferable range of q+j is about 49.5 at % to about 54.5 at %.

It is also preferred that the ratio j not be less than about 0.2 at % since the uniaxial exchange coupling magnetic field is not sufficiently improved. It is further preferred that the ratio j not exceed about 10 at % since the uniaxial exchange coupling magnetic field decreases.

The composition of the first antiferromagnetic layer may be the same as the composition of the second antiferromagnetic layer in the present invention. Such antiferromagnetic layers preferably have the following composition ratio.

In one embodiment, the first and second antiferromagnetic layers comprise an alloy represented by $X_mMn_{100-m}$, where X is at least one element from the group of Pt, Pd, Ir, Rh, Ru and Os. The subscript m represents the composition ratio of each of the first and second antiferromagnetic layers and is preferably in the range of about 49 at $\% \leq m \leq$ about 53.5 at %.

Consequently, the exchange coupling magnetic field of the first antiferromagnetic layer can be made as large as about $1.58 \times 10^4$ A/m, or more, while allowing the exchange coupling magnetic field of the first antiferromagnetic layer to be larger than the exchange coupling magnetic field of the second antiferromagnetic layer by applying the first heat treatment at a heat treatment temperature of about 245° C.

The exchange coupling magnetic field of the second antiferromagnetic layer can be also made to be about $1.58 \times 10^4$ A/m or more by applying the second heat treatment at a heat treatment temperature of about 270° C.

In a more preferable composition ratio m ranges from about 49.5 to about 52.7 at %. Most preferably, the upper limit of m is about 51.2 at % or less. These composition ranges permit the exchange coupling magnetic field of the first antiferromagnetic layer at about 245° C. to be larger, while making the difference between the exchange coupling magnetic fields of the first and second antiferromagnetic layers to be large, thereby enabling the directions of magnetization of the pinned magnetic layer and free magnetic layer to be readily controlled.

In another embodiment, the first and second antiferromagnetic layers are represented by $Pt_mMn_{100-m-n}Z_n$, where Z is at least one element from the group of Pd, Ir, Rh, Ru and Os. The subscripts m and n represent the composition ratio and are preferably in the ranges of about 49 at $\% \leq m+n \leq$ about 53.5 at % and about 0.2 at $\% \leq n \leq$ about 40 at % and, more preferably, the range of m is about 49.5 at % to about 52.7 at % and, most preferably, the upper limit is about 51.2 at % or less.

It is preferred that n not be less than about 0.2 at % since the effect for improving the uniaxial exchange coupling magnetic field is not fully manifested. It is also preferred that the ratio n not exceed about 40 at % since the uniaxial exchange coupling magnetic field decreases.

In yet another embodiment, the first and second antiferromagnetic layers are represented by $Pt_qMn_{100-q-j}L_j$, where L is at least one element from the group of Au, Ag, Cr, Ni, Ne, Ar, Xe and Kr. The subscripts q and j represent the composition ratios and are preferably in the ranges of about 49 at $\% \leq q+j \leq$ about 53.5 at % and about 0.2 at $\% \leq j \leq$ about 10 at % and, more preferably, the range of q is about 49.5 at % to about 52.7 at % and, most preferably, the upper limit is about 51.2 at % or less.

It is preferred that j be less than about 0.2 at % since the effect for improving the uniaxial exchange coupling magnetic field is not fully manifested. It is also preferred that the ratio j not exceed about 10 at % since the uniaxial exchange coupling magnetic field decreases.

The difference between the exchange coupling magnetic fields of the first and second antiferromagnetic layers may become more evident by allowing the composition of the first antiferromagnetic layer to be different from the composition of the second antiferromagnetic layer within the composition ranges as described above in the bottom type spin-valve type thin film magnetic element. This can be carried out by, for example, making the Mn concentration of the first antiferromagnetic layer to be larger than the Mn concentration in the second antiferromagnetic layer. As a result, magnetization of the free magnetic layer may be more certainly perpendicular to magnetization of the pinned magnetic layer after the second heat treatment. Many combinations for making the difference in the exchange coupling magnetic fields may be selected to improve the degree of freedom for designing the spin-valve type thin film magnetic element.

DESCRIPTION OF THE PREFERRED EMBODIMENT

Embodiments of the magnetic field sensing element (spin-valve type thin film magnetic element) according to the present invention will be described in detail hereinafter with reference to the drawings.

Figure 1:
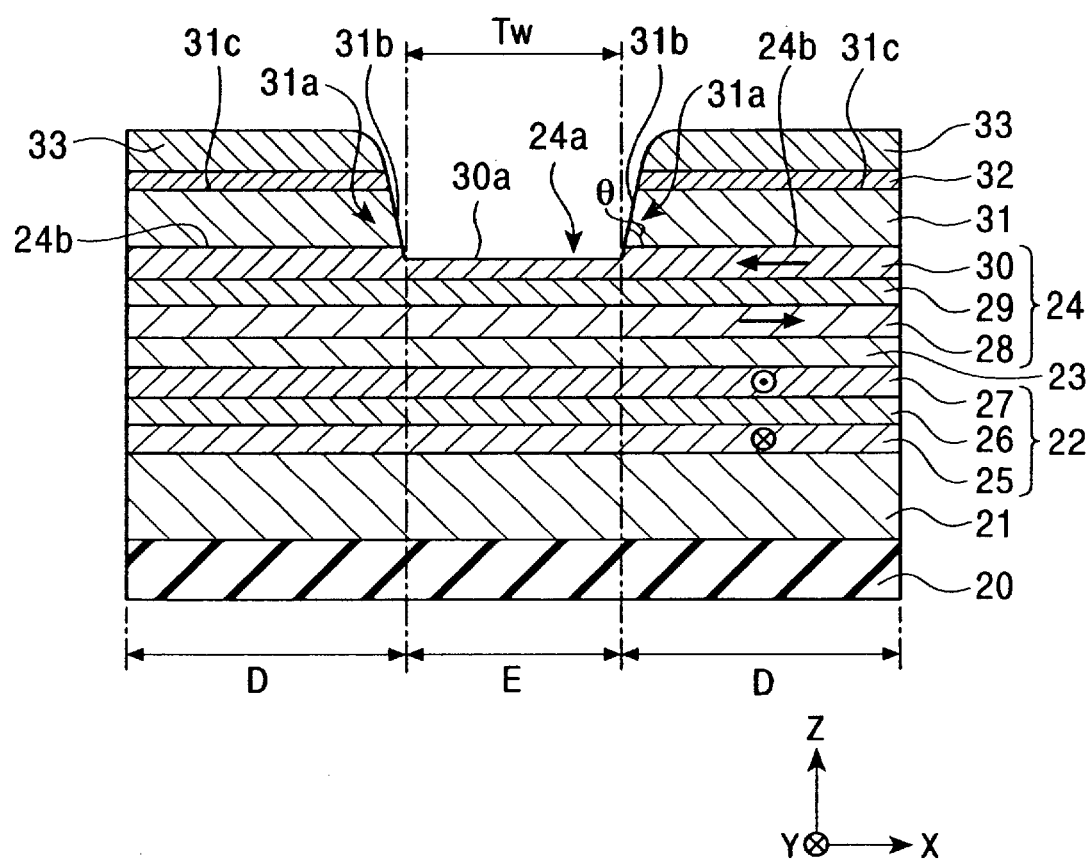
FIG. 1 is a cross-sectional view illustrating the structure of the magnetic field sensing element (a spin-valve type thin film magnetic element) as according to a first embodiment of the present invention viewed from the side facing a recording medium.

FIG. 1 illustrates a cross-sectional view of the structure of the magnetic field sensing element in accordance with a first embodiment of the present invention viewed from the side facing a recording medium.

A recording inductive head may be laminated on the spin-valve type thin film magnetic element. Also, the spin-valve type thin film magnetic element shown in FIG. 1 is provided, for example, at the edge of a trailing part of a slider of, for example, a hard disk device.

Figure 10:
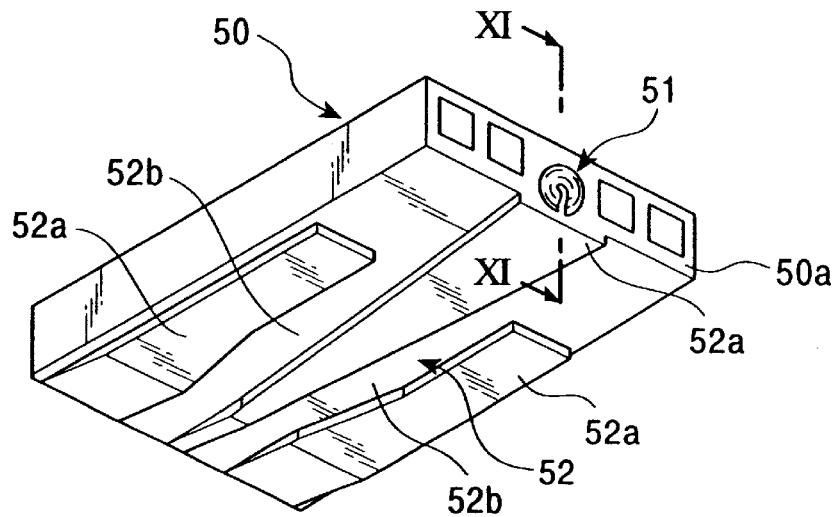
FIG. 10 illustrates a perspective view of a slider equipped with the magnetic field sensing element according to the present invention viewed from the side facing a recording medium.
Figure 11:
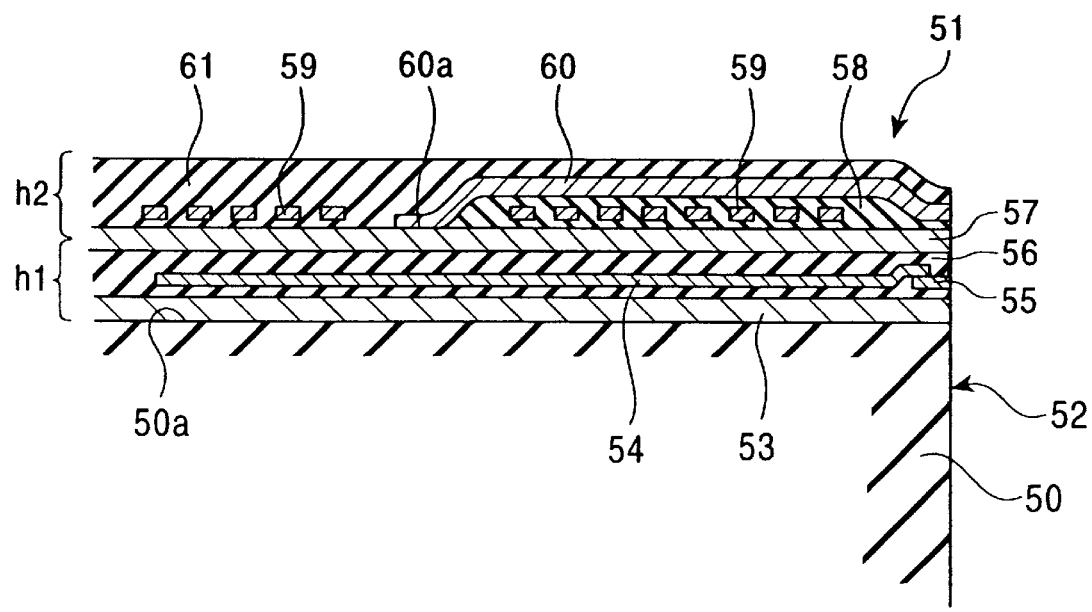
FIG. 11 illustrates a cross-sectional cut along the line 11—11 shown in FIG. 10.

FIGS. 10 and 11 show a magnetic head comprising the spin-valve type thin film magnetic element according to the present invention. FIG. 10 illustrates a cross-sectional view of the slider viewed from the side facing a recording medium, and FIG. 11 is a longitudinal cross-sectional view of the slider shown in FIG. 10, cut along the line 11—11 and viewed along the arrow in the drawing.

As shown in FIGS. 10 and 11, a GMR head h1 comprising the spin-valve type thin film magnetic element is provided at the side edge of the trailing side 50a of the slider 50 and, together with an inductive head h2, constitutes a thin film magnetic head 51. Thin film magnetic head 51 enables sensing and recording of the recording magnetic field of the magnetic recording medium, such as the hard disk device.

Rails 52a are formed on the face 52 of the slider 50 opposing the recording medium shown in FIG. 10, and air grooves 52b are formed between the adjoining rails.

The GMR head h1 comprises a lower shield layer 53, made of a magnetic alloy and formed on the end face 50a of the slider 50, a lower gap layer 54, laminated on the lower shield layer 53, a spin-valve type thin film magnetic element 55, exposed on the face 52 opposing to the recording medium, an upper gap layer 56, covering the spin-valve type thin film magnetic element 55, and an upper shield layer 57 covering the upper gap layer 56.

The upper shield layer 57 also serves as a lower core layer of the inductive head h2. Alternatively, the upper shield layer 57 and lower core layer may be independently provided.

The inductive head h2 comprises the lower core layer (upper shield layer) 57, a gap layer 58 laminated on the lower core layer 57, a coil 59, and an upper core layer 60 joined on the gap layer 58 on the opposed face to the recording medium and to the lower core layer 57 at the end 60a of the upper core layer 60. A protective layer 61 comprising, for example, alumina is laminated on the upper core layer 60.

The spin-valve type thin film magnetic element shown in FIG. 1 is a so-called bottom type spin-valve type thin film magnetic element in which a first antiferromagnetic layer 21, a pinned magnetic layer 22, a non-magnetic layer 23 and a free magnetic layer 24 are sequentially laminated on an insulation substrate 20 (a lower gap layer) made of $Al_2O_3$.

In the embodiment illustrated in FIG. 1, magnetization of the free magnetic layer 24 is aligned in the direction to intersect the direction of magnetization of the pinned magnetic layer 22 by an exchange bias method in the spin-valve type thin film magnetic element.

The exchange bias method is suitable for a spin-valve type thin film magnetic element having a narrow track width that corresponds to high density recording, as compared to a hard bias method that is difficult to control the effective track width and produces a dead zone.

The first antiferromagnetic layer 21 is made of an alloy comprising Mn and at least one element from the group of Pt, Pd, Ir, Rh, Ru, Ir, Os, Au, Ag, Cr, Ni, Ne, Ar, Xe and Kr. The first antiferromagnetic layer 21 comprising these alloys has excellent heat resistance and corrosion resistance.

The first antiferromagnetic layer 21 has good durability when it is equipped in a hard disk device where the element suffers from exposure to high temperature from other components in the device, such as the hard disk, or by a Joule's heat generated by a sense current flowing in the element. Accordingly, an excellent spin-valve type thin film magnetic element is provided in which fluctuation of the exchange anisotropic magnetic field (exchange coupling magnetic field) by temperature changes is small.

Also, the blocking temperature is elevated by forming the first antiferromagnetic layer 21 with the alloy described above. This allow a large exchange anisotropic magnetic field to be generated in the first antiferromagnetic layer 21, thereby enabling the direction of magnetization of the first antiferromagnetic layer 21 to be tightly fixed.

It is particularly preferable that the first antiferromagnetic layer 21 is an alloy having the composition formula (1) $X_m Mn_{100-m}$, where X is at least one element from the group of Pt, Pd, Ir, Rh, Ru and Os. The subscript m represents the composition ratio and is in the range of about 46 at $\% \leq m \leq$ about 53.5 at % and, more preferably, composition ratio is about 48.5 at $\% \leq m \leq$ about 52.7 at %.

In another embodiment, the first antiferromagnetic layer 21 may be an alloy having the composition formula (2) $Pt_m Mn_{100-m-n} Z_n$, where Z represents at least one element from the group of Pd, Ir, Rh, Ru and Os. The subscripts m and n have a composition ratio of about 46 at $\% \leq m+n \leq$ about 53.5 at % and about 0.2 at $\% \leq n \leq$ about 40 at % and, more preferably, a composition range of about 48.5 at $\% \leq m+n \leq$ about 52.7 at % and about 0.2 at $\% \leq n \leq$ about 40 at %.

In yet another embodiment, the first antiferromagnetic layer 21 may be an alloy having the structural formula. (3) $Pt_q Mn_{100-q-j} L_j$, where L is at least one element from the group of Au, Ag, Cr, Ni, Ne, Ar, Xe and Kr. The subscripts q and j have composition ratios of about 46 at $\% \leq q+j \leq$ about 53.5 at % and about 0.2 at $\% \leq j \leq$ about 10 at % and, more preferably, of about 48.5 at $\% \leq q+j \leq$ about 52.7 at % and about 0.2 at $\% \leq j \leq$ about 10 at %.

The first antiferromagnetic layer 21 is formed with a thickness of, for example, about 70 Å to about 300 Å.

The pinned magnetic layer 22 has a so-called ferrimagnetic structure comprising three layers of the first pinned magnetic layer 25, non-magnetic intermediate layer 26 and second pinned magnetic layer 27. Magnetization of the pinned magnetic layer 22 can be stabilized by this ferrimagnetic structure. For obtaining more stabilized ferrimagnetic structure, the first pinned magnetic layer 25 should have a different magnetic moment per unit area from that of the second pinned magnetic layer 27. The magnetic moment per unit area is determined by a product of the saturation magnetic flux density and film thickness. When the same material is used for the pinned magnetic layers 25 and 27, for example, one of the pinned magnetic layer may have a different magnetic moment per unit area from that of the other pinned magnetic layer by allowing their film thickness to be different with each other. For example, the first pinned magnetic layer has a thickness of about 15 Å, the non-magnetic intermediate layer has a thickness of about 8 Å, and the second finned magnetic layer has a thickness of about 20 Å.

The first and second pinned magnetic layers 25 and 27 comprise, for example, a Co film, MiFe alloy film, CoNiFe alloy film, CoFe film or CoNi film. The non-magnetic intermediate layer 26 are preferably made of an alloy comprising at least one element from the group of Ru, Rh, Ir, Cr, Re and Cu.

It is preferable that the first and second pinned magnetic layers 25 and 27 are made of the CoFe alloy, in order to increase the exchange coupling magnetic field in a RKKY interaction acting between the first and second pinned magnetic layers 25 and 27.

The first pinned magnetic layer 25 is formed in contact with the first antiferromagnetic layer 21 and, after applying a heat treatment in a magnetic field, an exchange coupling magnetic field is generated at an interface between the first pinned magnetic layer 25 and first antiferromagnetic layer 21.

Upon applying the heat treatment, magnetization of the first pinned magnetic layer 25 is fixed in the Y-direction (the height direction). Magnetization of the second pinned magnetic layer 26 is fixed, on the other hand, in the opposite direction to the Y-direction (the direction to the face opposed to the recording medium) by the RKKY interaction. This means that magnetization of the first pinned magnetic layer 25 and magnetization of the second pinned magnetic layer 26 are in an antiparallel relation with each other.

The non-magnetic layer 23 is preferably formed of a conductive non-magnetic material, such as Cu, Cr, Au or Ag.

The free magnetic layer 24 also has a ferrimagnetic structure comprising three layers of the first free magnetic layer 28, the non-magnetic intermediate layer 29 and the free magnetic layer 30. The first and second free magnetic layers 28 and 30 are made of, for example, a Co film, NiFe alloy film, CoNiFe alloy film, Co Fe alloy film or CoNi alloy film. The non-magnetic intermediate layer 29 is preferably made of an alloy comprising at least one element from the group of Ru, Rh, Ir, Cr, Re and Cu. For obtaining a more stable ferrimagnetic structure, the magnetic moment of the first free magnetic layer 28 per unit area should be different from that of the second free magnetic layer 30. The magnetic moment per unit area may be determined by a product of the saturation magnetic flux density and film thickness. For example, the free magnetic layers 28 and 30 may have different magnetic moments per unit area with each other by allowing the thickness of the former layer to be different from the thickness of the latter layer. Preferably, the first free magnetic layer 28 is formed to have a thickness of about 20 Å, the non-magnetic intermediate layer is formed to have a thickness of about 8 Å, and the second free magnetic layer is formed to have a thickness of about 15 Å.

A part of the surface of the second free magnetic layer 30 is shaved off as shown in FIG. 1, and a groove 24a is formed with a track width Tw. The formation of groove 24a is preferred since, if the second antiferromagnetic layer 31 is not completely shaved off, particularly when the thickness of the second antiferromagnetic layer 31 is irregular, a portion of the second antiferromagnetic layer 31 will remain in the central portion E of the element.

A flat area 24b is formed at both sides of the groove 24a. The second antiferromagnetic layer 31, comprising an antiferromagnetic material, is formed on the flat area 24b. This antiferromagnetic material may be the same as that used for forming the first antiferromagnetic layer 21.

Accordingly, the directions of magnetization at both side portions D of the second free magnetic layer 30 are aligned in the direction to intersect the direction of magnetization of the pinned magnetic layer 22, or in the track width direction (the opposite direction to the X-direction in FIG. 1) by the action of the exchange coupling magnetic field generated between the second antiferromagnetic layer 31 and second free magnetic layer 30 after applying the heat treatment. On the other hand, the directions of magnetization of the second free magnetic layer 30 at the intermediate region E is aligned in the track width direction by the bias magnetic field from the side portions D.

A RKKY interaction is imposed on the first free magnetic layer 28 via the non-magnetic intermediate layer 29, and the direction of magnetization of the first free magnetic layer 28 is properly aligned in the X-direction (the track width direction). Forming the free magnetic layer 24 as a so-called ferrimagnetic structure permits the two magnetic layers 28 and 30 in the free magnetic layer 24 to be in an antiparallel relation with each other as shown in FIG. 1, thereby attaining a thermally stable magnetization state. Consequently, Barkhausen noise as well as side reading can be appropriately suppressed while enabling good ΔMR to be obtained.

In similarity with the first antiferromagnetic layer 21, the second antiferromagnetic layer 31 preferably comprises an alloy containing Mn and at least one element from the group of Pt, Pd, Ir, Rh, Ru, Os, Au, Ag, Cr, Ni, Ne, Ar, Xe and Kr. The second antiferromagnetic layer 31 comprising these alloys has excellent heat resistance and corrosion resistance.

It is in particular preferable that the second antiferromagnetic layer 31 comprise an alloy having the composition formula (1) $X_m Mn_{100-m}$, where X is at least one element from the group of Pt, Pd, Ir, Rh, Ru and Os. The subscript m is the composition ratio and is in the range of about 49 at %≦m≦about 55.5 at % and, preferably, in the range of about 49.5 at % to about 54.5 at %.

In another embodiment, the second antiferromagnetic layer 31 may also comprise an alloy having the composition formula (2) $Pt_m Mn_{100-m-n} Z_n$, where, Z represents at least one of the elements from the group of Pd, Ir, Rh, Ru, Os, Au, Ag, Cr and Ni. The composition ratio subscripts m and n preferably satisfy the following relationship about 49 at %≦m+n≦about 55.5 at % and about 0.2≦n≦about 10 at % and, more preferably, m+n is about 49.5 at % to about 54.5 at %.

In yet another embodiment, the second antiferromagnetic layer 31 may comprise an alloy having the structure formula (3) $Pt_q Mn_{100-q-j} L_j$, where L represents at least one element from the group of Au, Ag, Cr, Ni, Ne, Ar, Xe and Kr. The subscripts q and j represent the composition ratios and preferably satisfy the relation of about 49 at %≦q+j≦about 55.5 at % and about 0.2 at %≦j≦about 10 at % and, more preferably, q+j is 49.5 at % to about 54.5 at %.

As shown in FIG. 1 according to the present invention, the electrode layers 33 and 33 are formed on the second antiferromagnetic layer 31 with the protective layer 32 therebetween. The protective layer 32 comprises, for example, Ta. The electrode layers 33 and 33 are preferably formed of, for example, Au, W, Cr and Ta.

A constant current flows from the electrode layers 33 and 33 to the free magnetic layer 24, non-magnetic layer 23 and pinned magnetic layer 22. When a leak magnetic field is applied from a magnetic recording medium running in the Z-direction to the Y-direction, the direction of magnetization of the first free magnetic layer 28 in the free magnetic layer 24 changes from the X-direction to the Y-direction. Electrical resistance changes in relation to the change of the direction of magnetization in the free magnetic layer 28 and the direction of magnetization of the second pinned magnetic layer 27, and the leaking magnetic field from the magnetic recording medium is sensed by voltage changes based on this resistance change.

The second antiferromagnetic layers 31 are separated by a distance corresponding to the track width Tw on the free magnetic layer 24. Layers 31 are substantially not tapered at the tip portions 31a and 31a, and are formed with a sufficient thickness.

As a result, a large exchange coupling magnetic field is generated between each of the second antiferromagnetic layers 31 and second free magnetic layer 30 formed under each tip portion 31a of each antiferromagnetic layer 31. Since the free magnetic layer 24 has a ferrimagnetic structure, magnetization of the free magnetic layer 24 is stabilized and, in particular, magnetization of the first free magnetic layer 28 is properly aligned in the track width direction to form a single magnetic domain.

The free magnetic layer 24 has a laminated ferrimagnetic structure in the present invention. Furthermore, the first free magnetic layer 28 is magnetized to be antiparallel to the direction of magnetization of the second free magnetic layer 30 by the RKKY interaction acting between the first free magnetic layer 28 and second free magnetic layer 30, when a longitudinal bias magnetic field is applied to the second free magnetic layer 30 by the exchange bias method, and subsequently the second free magnetic layer 30 is magnetized in one direction along the track width direction.

For properly maintaining the antiparallel magnetization state, the material of the first and second free magnetic layers should be improved in order to increase the exchange coupling magnetic field in the RKKY interaction acting between the first and second free magnetic layers.

A NiFe alloy has been frequently used for the magnetic material. While a NiFe alloy has been used owing to its excellent soft magnetic property, the antiparallel coupling force between the first and second free magnetic layers made of a NiFe alloy is weak when the free magnetic layers have the laminated ferrimagnetic structure.

In the present invention, a CoFeNi alloy is used for at least one of the first and second free magnetic layers, preferably for both layers, in order to improve the material for the first and second free magnetic layers and to enhance the antiparallel coupling force between the first and second free magnetic layers. Consequently, magnetization at the side edges of the first and second free magnetic layers located at both sides in the track width direction is prevented from fluctuating against the external magnetic field, thereby properly suppressing side reading. This is due to a synergetic effect of the antiparallel coupling force with the exchange coupling magnetic field acting between the first and second free magnetic layers.

Figure 14:
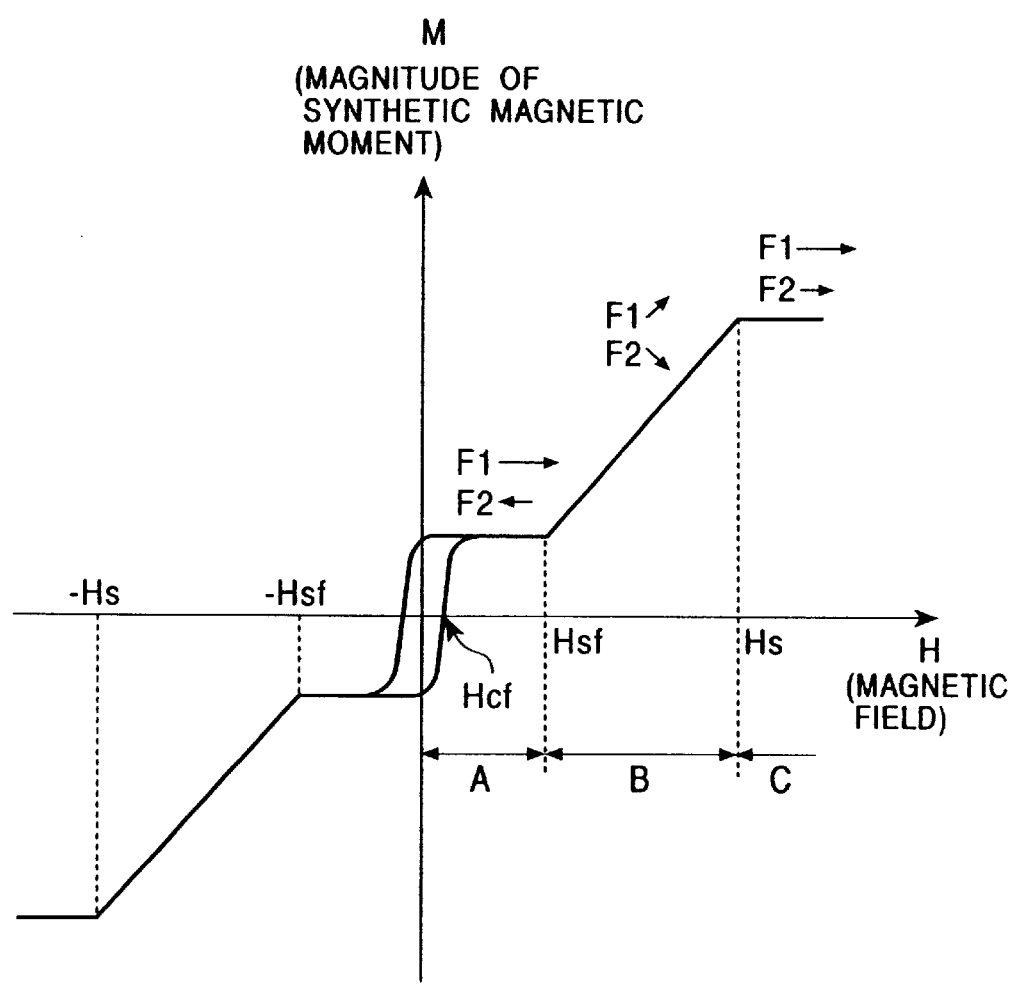
FIG. 14 illustrates a schematic drawing of a hysteresis curve of the free magnetic layer having a laminated ferrimagnetic structure.
Figure 15:
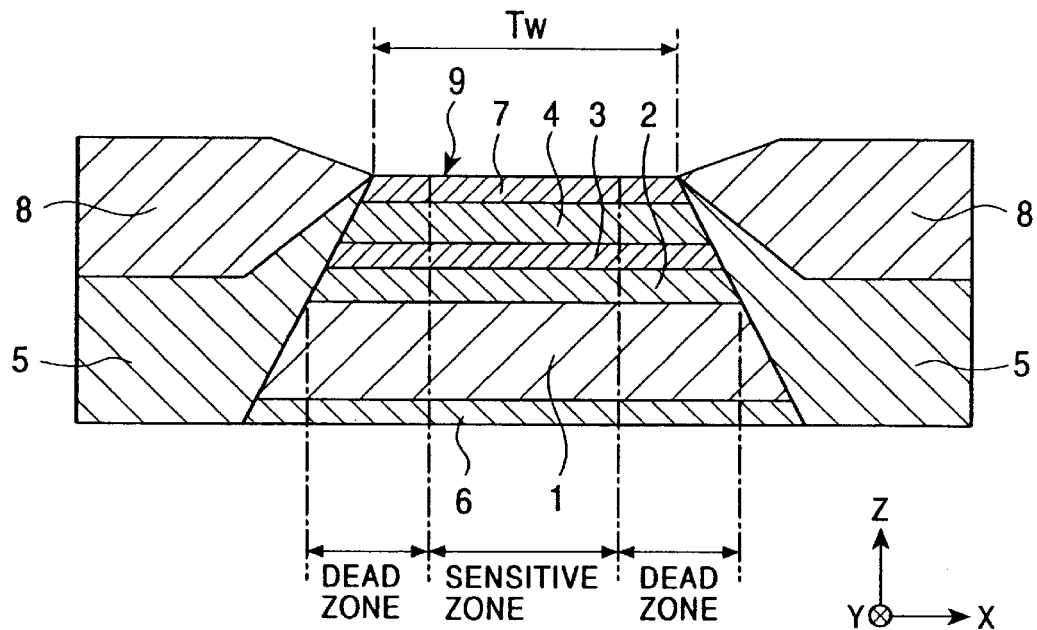
FIG. 15 is a cross-sectional view of a conventional magnetic field sensing element viewed from the side facing a recording medium.

FIG. 14 shows a schematic drawing of a hysteresis curve of the free magnetic layer having a laminated ferrimagnetic structure. Suppose that, for example, the magnetic moment per unit area (saturation magnetization Ms×film thickness t) of the first free magnetic layer (F1) is larger than the magnetic moment per unit area of the second free magnetic layer, and the external magnetic field is applied in the right direction in the drawing.

The synthetic magnetic moment per unit area, given by a product of the magnetic moment per unit area of the first free magnetic layer and the magnetic layer moment per unit area of the second free ($|Ms \cdot t(F1)+Ms \cdot t(F2)|$), is constant when the external magnetic field is increased to a given magnitude. In the area A, where the synthetic magnetic moment per unit area is constant, the magnetization of the first free magnetic layer and magnetization of the second free magnetic layer are put into the single magnetic domain states and kept in an appropriate antiparallel relation with each other, since the antiparallel coupling force acting between the first and second free magnetic layers is stronger than the external magnetic field.

However, when the external magnetic field is increased to the right direction in the graph, the synthetic magnetic moment per unit area increases with a given inclination angle. This is because magnetization of the first free magnetic layer and magnetization of the second free magnetic layer that have been in the single magnetic domain states have been dispersed to display multi-magnetic domain states, since the external magnetic field becomes stronger than the antiparallel coupling force between the first and second free magnetic layers, thereby increasing the synthetic magnetic moment per unit area that is determined by a vector sum. The antiparallel state between the free magnetic layers has already collapsed in the area B of the external magnetic field where the synthetic magnetic moment per unit area increases. The magnitude of the external magnetic field at the starting point for increasing the synthetic magnetic moment per unit area is termed as a spin-flop magnetic field (Hsf).

When the external magnetic field further increases in the right direction in the graph (the area C), magnetization of the first free magnetic layer and magnetization of the second free magnetic layer are again put into the single magnetic domain states. Unlike the case in the area A of the external magnetic field, however, both free magnetic layers are magnetized in the right direction in the drawing, and the synthetic magnetic moment per unit area in this area C of the external magnetic field becomes constant. The magnitude of the external magnetic field at the point where the synthetic magnetic moment per unit area becomes constant is termed as a saturation magnetic field (Hs).

In the present invention, the magnetic field for collapsing the antiparallel state, or the spin-flop magnetic field (Hsf), can be sufficiently increased by using the CoNiFe alloy for the first and second free magnetic layers, as compared with using the NiFe alloy.

The experiments for determining the magnitude of the spin-flop magnetic field using the NiFe alloy (comparative examples) and CoFeNi alloy (examples) for the first and second free magnetic layers were carried out using the following film construction in the present invention: substrate/non-magnetic layer (Cu)/first free magnetic layer (2.4)/non-magnetic intermediate layer (Ru)/second free magnetic layer (1.4). The figure in each parenthesis denotes the film thickness of each layer in a nanometer unit.

The NiFe alloy with a Ni composition of about 80 at % and Fe composition of about 20 at % was used for the first and second free magnetic layers in the comparative examples. The spin-flop magnetic field (Hsf) in these comparative examples is about 59 kA/m.

The CoFeNi alloy with a Co composition of about 87 at %, Fe composition of about 11 at % and Ni composition of about 2 at % was used for the first and second free magnetic layers in the examples. The spin-flop magnetic field (Hsf) in these examples is about 293 kA/m.

It was evident that the spin-flop magnetic field can be effectively increased by using the CoFeNi alloy for the first and second free magnetic layers as compared with using the NiFe alloy.

The composition ratio of the CoFeNi alloy will be described below. It has been shown that the magnetic distortion shifts to the positive side by a magnitude of $1 \times 10^{-6}$ to $6 \times 10^{-6}$ when the CoFeNi alloy used contacts a Ru layer, as compared with using the NiFe alloy.

The magnetic distortion is preferably in the range of about $-3 \times 10^{-6}$ to about $3 \times 10^{-6}$. The coercive force is preferably about 790 A/m or less. The lower magnetic distortion is preferable since the layer becomes susceptible to the stress due to distortion by film deposition or by a difference of the heat expansion coefficient between the free magnetic layer and other layers. The lower value is more preferable for the coercive force for facilitating magnetic inversion of the free magnetic layer against the external magnetic field.

It is also preferable in the present invention that at least one of the first free magnetic layer 28 and the second free magnetic layer 30 is formed of a magnetic material having the composition formula of CoFeNi with a Fe content of about 9 at % to about 17 at %, and a Ni content of about 0.5 at % to about 10 at % with a balance of Co.

The composition above permits the contribution of the exchange coupling magnetic field generated between the first free magnetic layer 28 and the second free magnetic layer 30 to the RKKY interaction to be increased. Practically, the magnetic field for collapsing the antiparallel state, or the spin-flop magnetic field (Hsf), can be increased to about 293 kA/m. Accordingly, the directions of magnetization at side edges of the first free magnetic layer 28 and the second free magnetic layer 30, located under the second antiferromagnetic layer 31, may be properly pinned in the antiparallel state by an synergetic effect of the antiparallel coupling force with the exchange coupling magnetic field acting between the second antiferromagnetic layer 31 and second free magnetic layer 30 to suppress side reading.

In the present invention, both the first free magnetic layer 28 and the second free magnetic layer 30 are preferably formed of the CoFeNi alloy in order to obtain a high spin-flop magnetic field, thereby allowing the first free magnetic layer 28 and the second free magnetic layer 30 to be magnetized in an antiparallel state with each other.

When the composition is within the range described above, magnetic distortion can be restricted within the range of about $3 \times 10^{-6}$ to about $3 \times 10^{-6}$, while reducing the coercive force to about 790 A/m.

It is also possible to improve the soft magnetic property of the free magnetic layer 24, and to properly suppress changes of the magnetoresistance (ΔR) and magnetoresistivity (ΔR/R) due to diffusion of Ni between the non-magnetic layer 23 and free magnetic layer 24.

Although the inner side faces 31b of the second antiferromagnetic layers 31 are inclined as shown in FIG. 1, they may be adjusted to be approximately vertical (Z-direction) in the present invention. The inner angle θ of the inclined face is preferably about 70° to about 90°.

The tip portion 31a of the second antiferromagnetic layer 31 can be made thick by the manufacturing method to be described below.

The surface 30a of the second free magnetic layer 30 at the central area E of the element is shave off by using the manufacturing method according to the present invention, and the thickness of this portion becomes smaller than the thickness at both sides of the second free magnetic layer 30.

Figure 16:
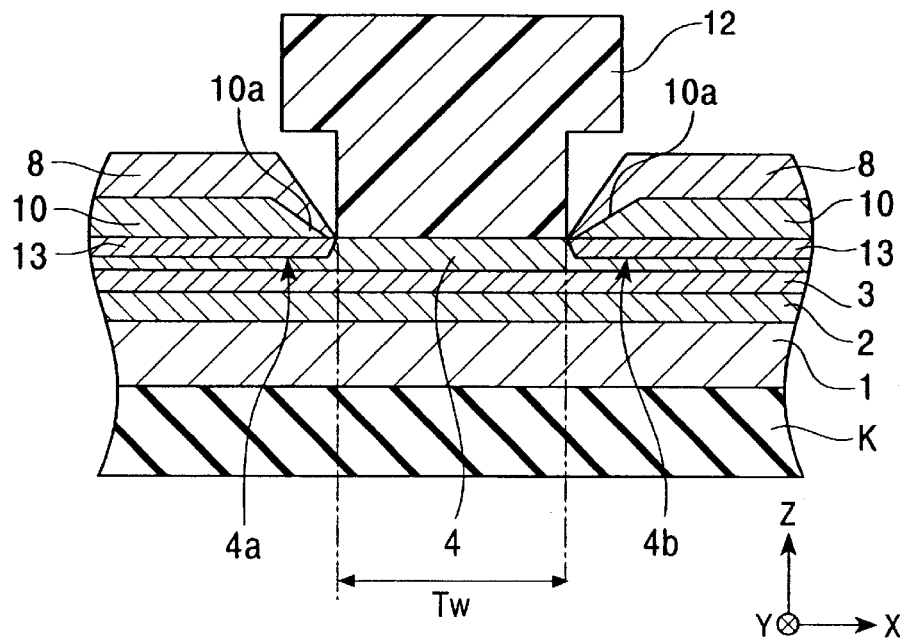
FIG. 16 shows a cross section of one manufacturing step of another magnetic field sensing element.

The electrode layer 33 formed on the second antiferromagnetic layer 31 is located only on the flat surface 31c of the second antiferromagnetic layer 31 as shown in FIG. 1. On the other hand, in the conventional example shown in FIG. 16, the electrode layer 8 is formed not only on the flat surface of second antiferromagnetic layer 10 but also elongated on the inclined surface of the second antiferromagnetic layer 10.

The difference between the method in the present invention and conventional method is ascribed to the difference in the manufacturing methods, and hence it is possible to distinguish them from the difference between the structures.

Figure 2:
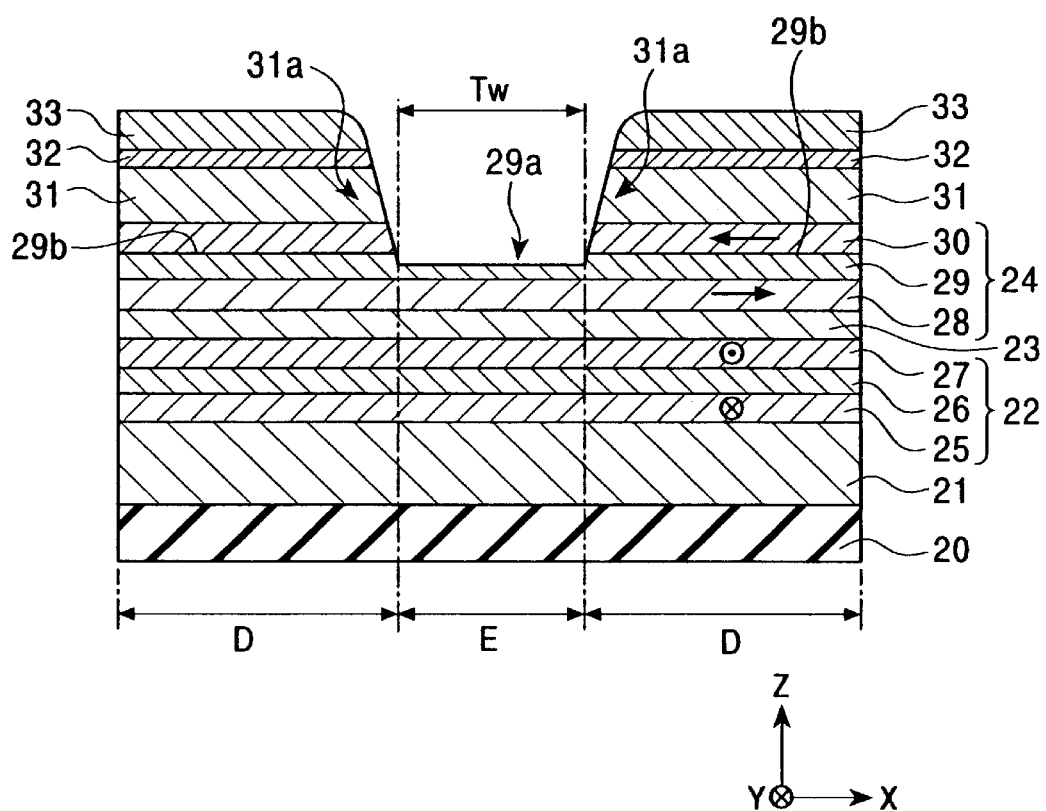
FIG. 2 is a cross-sectional view illustrating the structure of the magnetic field sensing element according to another embodiment of the present invention viewed from the side facing a recording medium.

FIG. 2 shows another embodiment of the spin-valve type thin film magnetic element. The layers having the same reference numerals as in FIG. 1 denote the same layer as in FIG. 1. The difference between the spin-valve type thin film magnetic element in FIG. 2 from that in FIG. 1 is that the second free magnetic layer 30 is completely removed at the central area E of the element, and the non-magnetic layer 29 is exposed.

In the spin-valve type thin film magnetic element of FIG. 2, a portion of the surface of the non-magnetic intermediate layer 29 is removed, and a groove 29a is formed. The track width Tw is determined by the width of the groove 29a. Both sides of the groove 29a have flat portions 29b, and a second free magnetic layer 30, second antiferromagnetic layer 31, protective layer 32 and electrode layer 33 are formed on each flat portion 29b.

When only the non-magnetic intermediate layer 29 is formed on the first free magnetic layer 28 as described above, the non-magnetic intermediate layer 29 serves as a backed layer to display a so-called spin-filter effect.

The mean free path of (+)-spin (up-spin) electrons that contribute to the magnetoresistive effect is elongated when the non-magnetic intermediate layer 29 functions as a back layer, and a large change in magnetoresistance is attained by the spin-filter effect to enable the element to comply with high density recording. The non-magnetic intermediate layer 29 (back layer) is preferably formed of Cu for allowing the spin-filter effect to be properly generated.

In this embodiment the tip portion 31a of the second antiferromagnetic layer 31 can be also formed with a large film thickness, and a large exchange coupling magnetic field can be generated between the tip portion 31a of the second antiferromagnetic layer 31 and second free magnetic layer 30. Since the free magnetic layer 24 has a ferrimagnetic structure comprising three layers at side edges D of the free magnetic layer 24, magnetization of the second free magnetic layer 30 and magnetization of the first free magnetic layer 28 are stabilized in an antiparallel relation with each other. Accordingly, the first free magnetic layer 28 is put into a single magnetic domain state in the X-direction (track width direction) at the central area E of the element. Consequently, the element can comply with narrowing of the track width for high density recording and suppress Barkhausen noise from generating, thereby enabling a magnetic field sensing element capable of suppressing side-reading from generating to be manufactured.

It is preferable in the present invention to form at least one of the first free magnetic layer 28 and second free magnetic layer 30 with a magnetic material having the composition formula of CoNiFe comprising about 9 at % to about 17 at % of Fe, and about 0.5 at % to about 10 at % of Ni with a balance of Co.

The composition above allows the contribution of the exchange coupling magnetic field to be enhanced in the RKKY interaction generated between the first free magnetic layer 28 and second free magnetic layer 30. Further, the magnitude of the magnetic field for collapsing the antiparallel state, or the spin-flop magnetic field (Hsf), can be increased to about 293 kA/m. Accordingly, magnetization at the side edges of the first free magnetic layer 28 and second free magnetic layer 30, located under the second antiferromagnetic layer 31, can be properly pinned in a antiferromagnetic state with each other to suppress side-reading. In the present invention, both the first and second free magnetic layers 28 and 30 are preferably made of the CoFeNi alloy because a more stable and high spin-flop magnetic field is obtained.

Magnetic distortion of the free magnetic layer 24 can be restricted within the range of about $-3\times10^{-6}$ to about $3\times10^{-6}$, and the coercive force is reduced to about 790 A/m or less when the composition is within the range described above. It is also possible to improve the soft magnetic property of the free magnetic layer 24, and to properly suppress the changes of the magnetoresistance ($\Delta R$) and magnetoresistivity ($\Delta R/R$) caused by diffusion of Ni between the non-magnetic layer 23 and free magnetic layer 24.

While the pinned magnetic layer 22 is formed to have a ferrimagnetic structure comprising three layers as illustrated in FIGS. 1 and 2, this layer may comprise a single magnetic layer as in the conventional one. In the pinned magnetic layer 22 it is also preferable to form a Co film on the surface of the second pinned magnetic layer 27 at the side in contact with the non-magnetic layer 23. This Co film prevents metal elements from diffusing at the interface between the second pinned magnetic layer 27 and the non-magnetic layer 23, which is formed of Cu to so as permit $\Delta MR$ to be large. The Co film has a thickness of about 5 Å.

Figure 3:
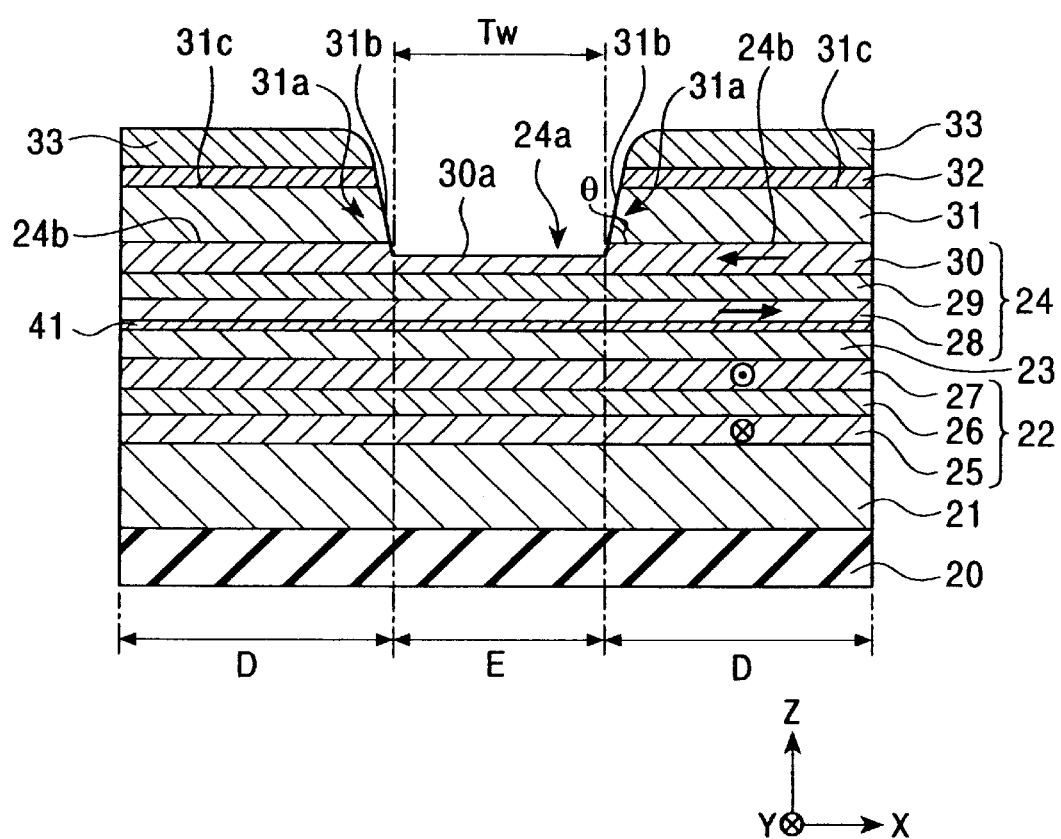
FIG. 3 is a cross-sectional view illustrating the structure of the magnetic field sensing element in accordance with yet another embodiment of the present invention viewed from the side facing a recording medium.

FIG. 3 shows the structure of the spin-valve type thin film magnetic element according to a third embodiment of the present invention. The layers having the same reference numerals as in FIG. 1 denotes the same layers as in FIG. 1.

FIG. 3 differs from FIG. 1 in that an intermediate layer 41 is provided between the second free magnetic layer 28 and non-magnetic layer 23. The intermediate layer 41 is preferably formed of the CoFe alloy or Co alloy, however, the CoFe alloy is particularly preferable.

Forming the intermediate layer 41 prevents metal elements from diffusing between the non-magnetic layer 23 and second free magnetic layer 28, and permits the magnetoresistance change ($\Delta R$) and magnetoresistivity ($\Delta R/R$) to be improved. The intermediate layer 41 has a thickness of about 5 Å.

As described with reference to FIGS. 1 and 2, diffusion of the metal elements between the non-magnetic layer 23 and second free magnetic layer 28 may be appropriately suppressed by forming the first free magnetic layer 28 in contact with the non-magnetic layer 23 using the CoFeNi alloy. Therefore, the need of forming the intermediate layer 41, comprising the CoFe alloy or Co, between the first free magnetic layer 28 and non-magnetic layer 23 may be eliminated as compared with the first free magnetic layer 28 comprising, for example, a NiFe alloy that does not contain Co.

However, it is preferable to provide the intermediate layer 41, comprising the CoFe alloy or Co, between the first free magnetic layer 28 non-magnetic layer 23 for preventing metal elements from diffusing between the first free magnetic layer 28 and non-magnetic layer 23, even when the first free magnetic layer is formed of the CoFeNi alloy.

Preferably, the composition ratio of Fe is about 7 at % to about 15 at %, and the composition ratio of Ni is about 5 at % to about 15 at % with a balance of Co, when the intermediate layer 41 is provided between the first free magnetic layer 28 and non-magnetic layer 23, and when at least one of the first free magnetic layer 28 and second free magnetic layer 30 is formed of the CoFeNi alloy.

The compositions above allows the exchange coupling magnetic field in the RKKY interaction generated between the first free magnetic layer 28 and second free magnetic layer 30 to be strong. Importantly, the magnetic field that collapses the antiparallel state, or the spin-flop magnetic field (Hsf), can be increased up to about 293 kA/m. Consequently, the directions of magnetization at both side edges of the first and second free magnetic layers 28 and 30, located under the second antiferromagnetic layer 31, may be properly pinned in an antiparallel state with each other to suppress side-reading. In the present invention, it is preferable to form both the first and second free magnetic layers 28 and 30 with the CoFeNi alloy. This composition permits a high spin-flop magnetic field to be obtained.

Magnetic distortion of the free magnetic layer 24 may be restricted within the range of about $-3\times10^{-6}$ to about $3\times10^{-6}$ in the composition range as described above, while reducing the coercive force to about 790 A/m or less. In addition, soft magnetic properties of the free magnetic layer 24 may be also improved.

The embodiment shown in FIG. 3 may be also applied to the embodiment in FIG. 2.

The method for manufacturing the magnetic field sensing element according to the present invention will be described hereinafter with reference to the drawings. FIGS. 4 to 9 illustrate cross-sectional views cut in the direction parallel to the face opposed to the recording medium.

Figure 4:
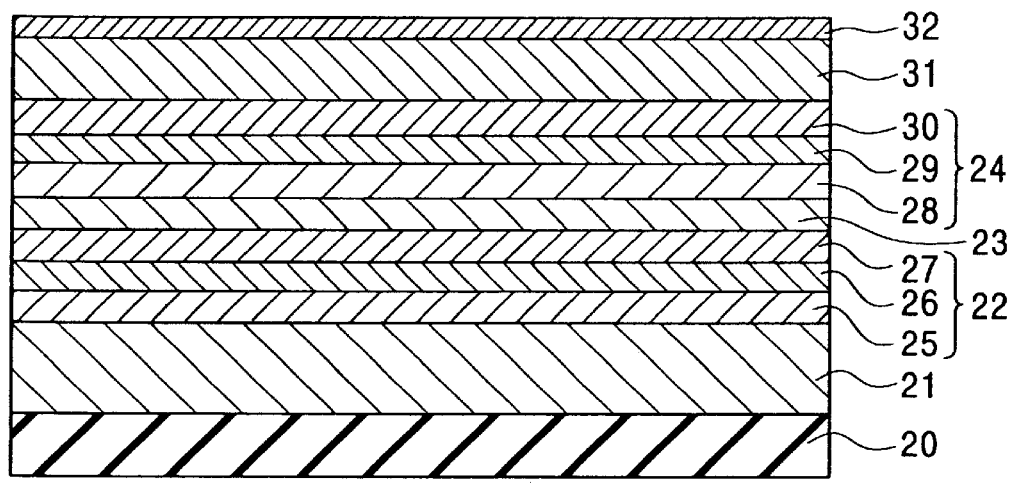
FIG. 4 illustrates a manufacturing step of the method for manufacturing the magnetic field sensing element according to the present invention.

In FIG. 4, the first antiferromagnetic layer 21 is deposited by sputtering on the insulation substrate 20 formed of, for example, $Al_2O_3$. It is preferable to form the first antiferromagnetic layer 21 with an alloy containing Mn and at least one element from the group of Pt, Pd, Ir, Rh, Ru, Os, Au, Ag, Cr, Ni, Ne, Ar, Xe and Kr.

Subsequently, the pinned magnetic layer 22, non-magnetic layer 23, free magnetic layer 24 and antiferromagnetic layer 31 are continuously deposited on the first antiferromagnetic layer 21.

The pinned magnetic layer is preferably formed in a ferrimagnetic state comprising the first pinned magnetic layer 25, non-magnetic intermediate layer 26 and second pinned magnetic layer 27.

Also, the free magnetic layer 24 is formed into a ferrimagnetic structure comprising three layer films of the first free magnetic layer 28, non-magnetic intermediate layer 29 and second free magnetic layer 30.

It is preferable to form the first pinned magnetic layer 25, second pinned magnetic layer 27, first free magnetic layer 28 and second free magnetic layer 30 with the Co film, NiFe alloy, CoNiFe alloy, CoFe alloy or CoNi alloy. The non-magnetic intermediate layers 26 and 29 are formed of a metal from the group of Ru, Rh, Ir, Cr, Re and Cu, or an alloy comprising at least two of these metals.

At least one of the first and second free magnetic layers 28 and 30 is preferably formed of the CoFeNi alloy. It is preferable that in the CoFeNi alloy the composition ratio of Fe is about 9 at % to about 17 at %, and the composition ratio of Ni is about 0.05 at % to about 10 at % with a balance of Co.

When the intermediate layer 41, comprising Co or the CoFe alloy, is provided between the first free magnetic layer 28 and the non-magnetic layer 23, as shown in FIG. 3, at least one of the first and second free magnetic layers 28 and 30 is preferably formed of the CoFeNi alloy, wherein the composition ratio of Fe is about 7 at % to about 15 at %, and the composition ratio of Ni is about 5 at % to about 15 at % with a balance of Co.

The composition above permits the exchange coupling magnetic field in the RKKY interaction generated between the first and second free magnetic layers 28 and 30 to be strong. In practice, the magnetic field for collapsing the antiparallel state, or the spin-flop magnetic field (Hsf), can be increased to about 293 kA/m. Accordingly, the directions of magnetization at both side edges of the first and second free magnetic layers 28 and 30 located under the second antiferromagnetic layer 31 are pinned in an antiparallel state with each other, thereby enabling side-reading to be suppressed.

It is preferable in the present invention that both the first and second free magnetic layers 28 and 30 are formed of the CoFeNi alloy, since a high spin-flop magnetic field may be obtained.

Magnetic distortion of the free magnetic layer 24 may be restricted within the range of about $-3 \times 10^{-6}$ to about $3 \times 10^{-6}$, and the coercive force is reduced to about 790 A/m in the composition range described above. Soft magnetic properties of the free magnetic layer 24 may be also improved.

The second antiferromagnetic layer 31 is preferably formed of an alloy containing Mn and at least one element of Pt, Pd, Ir, Rh, Ru, Os, Au, Ag, Cr, Ni, Ne, Ar, Xe and Kr.

As shown in FIG. 4, a protective layer 32 comprising, for example, Ta, is formed on the second antiferromagnetic layer 31.

In the present invention, the first antiferromagnetic layer 21 trough second antiferromagnetic layer 31 are continuously deposited. Accordingly, each layer is formed without making contact with air. Therefore, the laminate can be easily manufactured since cleaning by ion-milling and inverse sputtering of a surface that has been in contact with the air is not required, as is the case when the surface of each layer contacts air. The manufacturing method also has excellent reproducibility. Furthermore, the manufacturing method is improved by eliminating the problems arising from cleaning contamination from the surface of each layer resulting from re-adsorption and by eliminating adverse effects on generation of the exchange coupling magnetic field caused by distorted crystallinity of the surface. Accordingly, in the continuous film deposition method of the invention proper exchange coupling magnetic field may generated between the first antiferromagnetic layer 21 and first pinned magnetic layer 25, and second antiferromagnetic layer 31 and second free magnetic layer 30, without any cleaning process.

Figure 5:
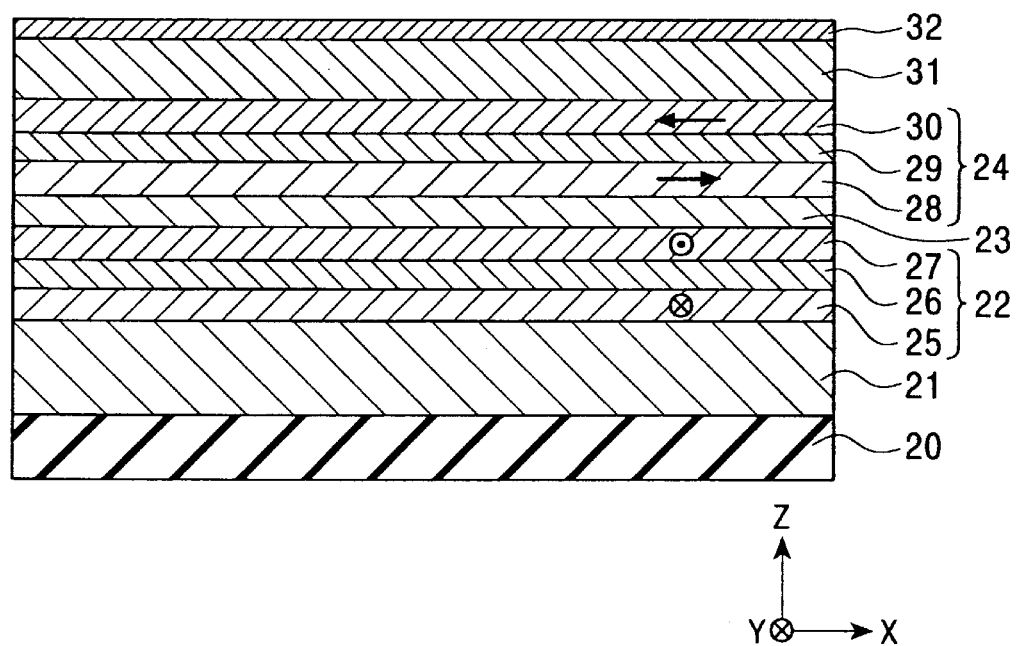
FIG. 5 illustrates a manufacturing step following the step in FIG. 4.

In the next step shown in FIG. 5, a first heat treatment is applied. At first, the laminate is heat treated at the first heat treatment temperature while applying a first magnetic field in the direction (the Y-direction) perpendicular to the track width direction Tw (the X-direction). Then, the directions of magnetization of the first pinned magnetic layer 25 and second free magnetic layer 30 are aligned in the same direction with each other by allowing the first and second antiferromagnetic layers 21 and 31 to generate exchange coupling magnetic fields. The exchange coupling magnetic field of the first antiferromagnetic layer 21 is adjusted to be larger than the exchange coupling magnetic field of the second antiferromagnetic layer 31 in this step.

Figure 12:
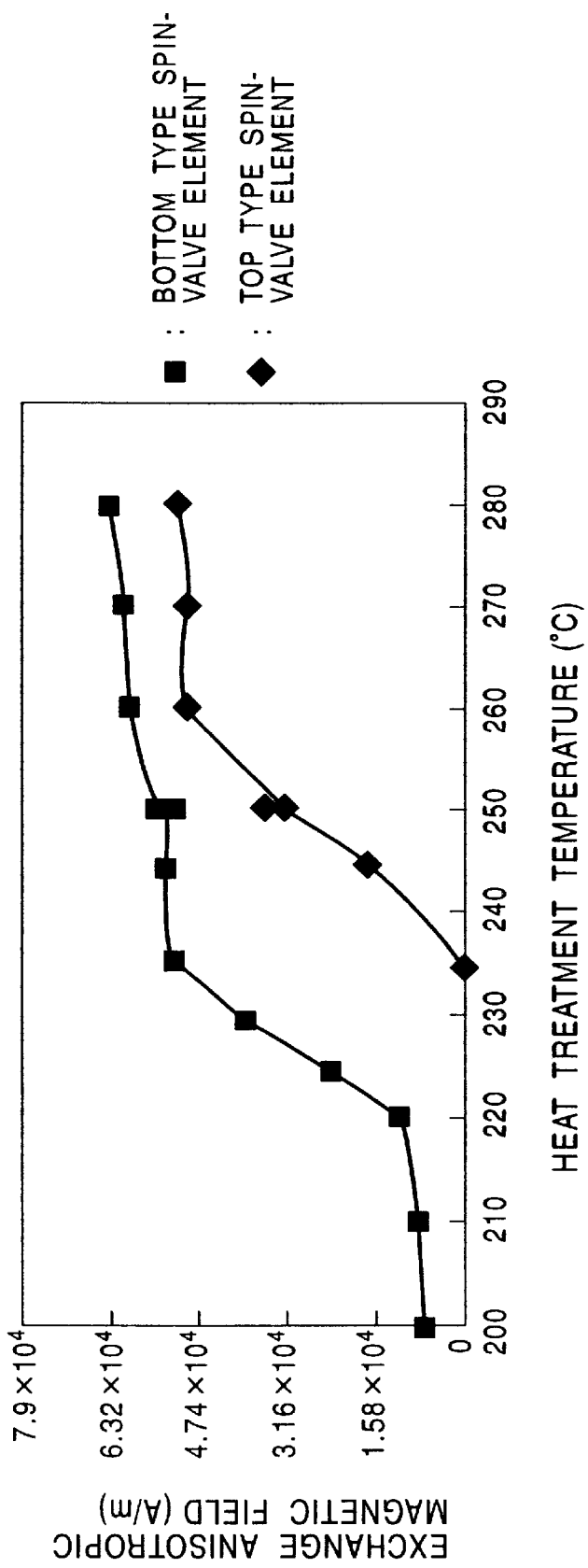
FIG. 12 is a graph illustrating the relation between the heat treatment temperature and exchange coupling magnetic field in the bottom type spin-valve type thin film magnetic element and top type spin-valve type thin film magnetic element according to the invention.

FIG. 12 is a graph showing the relation between the heat treatment temperature and exchange coupling magnetic field in a bottom type spin-valve thin film magnetic element and a top type spin-valve thin film magnetic element.

The film composition of the top-type spin-valve thin film magnetic element comprises an insulation film as an underlayer comprising about 1000 Å of $Al_2O_3$, an underlayer comprising about 50 Å of Ta, a free magnetic layer comprising two layers of NiFe alloy of about 70 Å each and of about 10 Å of Co therebetween, a non-magnetic layer comprising about 30 Å of Cu, a pinned magnetic layer comprising about 25 Å of Co, an antiferromagnetic layer comprising about 300 Å of $Pt_{55.4}Mn_{44.6}$ and a protective layer comprising about 50 Å of Ta sequentially formed on a Si substrate.

The film composition of the bottom type spin-valve thin film magnetic element comprises an insulation layer as an underlayer comprising about 1000 Å of $Al_2O_3$, an underlayer comprising about 30 Å of Ta, an antiferromagnetic layer comprising about 300 Å $Pt_{55.4}Mn_{44.6}$, a pinned magnetic layer comprising about 25 Å of Co, a non-magnetic layer comprising about 26 Å of Cu, a free magnetic layer comprising two layers each of about 10 Å of Co and about 70 Å of a NiFe alloy, and a protective layer comprising about 50 Å of Ta sequentially formed on a Si substrate.

FIG. 12 shows that the exchange coupling magnetic field of the bottom type spin-valve thin film magnetic element (denoted as ■), in which the antiferromagnetic layer is close to the substrate (or the antiferromagnetic layer is placed under the pinned magnetic layer), arises at about 200° C. and exceeds $4.74 \times 10^4$ A/m at around 240° C. On the other hand, the exchange coupling magnetic field of the top type spin-valve thin film magnetic element (denoted as ♦), in which the antiferromagnetic layer is remote from the substrate (or the antiferromagnetic layer is placed above the pinned magnetic layer), arises at 240° C. and exceeds about $4.74 \times 10^4$ A/m for the first time at around 260° C.

The antiferromagnetic layer of the bottom type spin-valve thin film magnetic element, in which the antiferromagnetic layer is close to the substrate (or the antiferromagnetic layer is placed under the pinned magnetic layer) as described above, can exhibit a high exchange coupling magnetic field at a relatively low heat treatment temperature, as compared with the exchange coupling magnetic field of the top spin-valve type thin film magnetic element denoted as in which the antiferromagnetic layer is remote from the substrate (or the antiferromagnetic layer is placed above the pinned magnetic layer).

The spin-valve type thin film magnetic element according to the present invention is a bottom type spin-valve thin film magnetic element in which the first antiferromagnetic layer is placed close to the substrate, and the second antiferromagnetic layer, formed of the same material as the first antiferromagnetic layer, is placed more remote from the substrate than first antiferromagnetic layer.

Accordingly, the magnetization direction of the pinned free magnetic layer and the free magnetic layer can be fixed in the same direction with each other by generating exchange coupling magnetic fields in the first and second antiferromagnetic layer in the method for manufacturing the spin-valve type thin film magnetic element according to the present invention. In the inventive method, the laminate is heat-treated at a first heat treatment temperature of about 220° C. to about 245° C., while applying a first magnetic field. An exchange coupling magnetic field of at least about $1.58 \times 10^4$ A/m and, preferably, about $4.74 \times 10^4$ A/m, may be obtained by the foregoing process, while the exchange coupling magnetic field of the second antiferromagnetic layer is reduced to be smaller than the exchange coupling magnetic field of the first antiferromagnetic layer, or to be smaller than about $1.58 \times 10^4$ A/m.

Subsequently, the laminate is heat-treated at a second heat-treatment temperature of about 250° C. to about 270° C. while applying a second magnetic field in the direction perpendicular to the first magnetic field. Accordingly, an exchange coupling magnetic field is obtained in the second antiferromagnetic layer of about $3.16 \times 10^4$ A/m or more, which is larger than the exchange coupling magnetic field of the second antiferromagnetic layer generated by the foregoing heat treatment. As a result, the direction of magnetization of the free magnetic field changes to the track width direction from the height direction.

When the second magnetic field is made to be smaller than the exchange coupling magnetic field of the first antiferromagnetic layer generated by the previous heat treatment, the exchange coupling magnetic field of the first antiferromagnetic layer is not degraded by applying the second magnetic field to the first antiferromagnetic layer. This enables the direction of magnetization of the pinned magnetic layer to remain fixed in the height direction.

According to the present invention, the magnetization direction of the pinned magnetic layer and the free magnetic layer can be properly adjusted so as to intersect with each other as described above in the manufacturing method. Alloys such as PtMn have an excellent heat resistance are used not only in the first antiferromagnetic layer but also in the second antiferromagnetic layer. Consequently, an exchange coupling magnetic field, which allows the direction of magnetization of the free magnetic layer to be aligned so as to intersect the magnetization direction of the pinned magnetic layer, is generated without adversely affecting the magnetization direction of the pinned magnetic layer. Therefore, a spin-valve type thin film magnetic element having excellent heat resistance and waveform symmetry in the regenerated signals can be manufactured.

The experimental results described above show that the first heat treatment temperature is preferably adjusted to be about 220° C. to about 245° C. It is also preferable that the second heat treatment temperature is about 250° C. to about 270° C.

The relationship between the composition of the antiferromagnetic layer and the exchange coupling magnetic field when the heat treatment temperature is about 245° C. or about 270° C. will be described in detail with reference to FIG. 13. The plots containing the symbols Δ and ▲ denote the relationship between the composition of the antiferromagnetic layer and the exchange coupling magnetic field of the top type single spin-valve type thin film magnetic element in which the antiferromagnetic layer is subjected to a heat treatment at about 270° C. and about 245° C., respectively.

Correspondingly, the plots containing the symbols ○ and ● denote the relationship between the composition of the antiferromagnetic layer and the exchange coupling magnetic field of the bottom type single spin-valve type thin film magnetic element in which the antiferromagnetic layer is subjected to a heat treatment at about 270° C. and about 245° C., respectively.

The film construction of the top type spin-valve thin film magnetic element, comprises an insulation layer as an underlayer comprising about 1000 Å of $Al_2O_2$, an underlayer comprising about 50 Å of Ta, two layers of free magnetic layers each comprising about 70 Å of NiFe alloy and about 10 Å of Co therebetween, a non-magnetic layer comprising about 30 Å of Cu, a pinned magnetic layer comprising about 25 Å of Co, an antiferromagnetic layer comprising about 300 Å of $Pt_mMn_n$, and a protective layer 220 comprising about 50 Å of Ta sequentially formed on the Si substrate.

Correspondingly, the bottom type spin-valve thin film magnetic element, denoted by the symbols ○ and ●, comprises an insulation layer as an underlayer comprising about 1000 Å of $Al_2O_2$, an underlayer comprising about 30 Å of Ta, an antiferromagnetic layer comprising about 300 Å of $Pt_mMn_n$, a pinned magnetic layer comprising about 25 Å of Co (25), a non-magnetic layer comprising about 26 Å of Cu, two layers of free magnetic layers each comprising about 10 Å of Co and about 70 Å of NiFe alloy and a protective layer comprising about 50 Å of Ta sequentially formed on the Si substrate.

Figure 13:
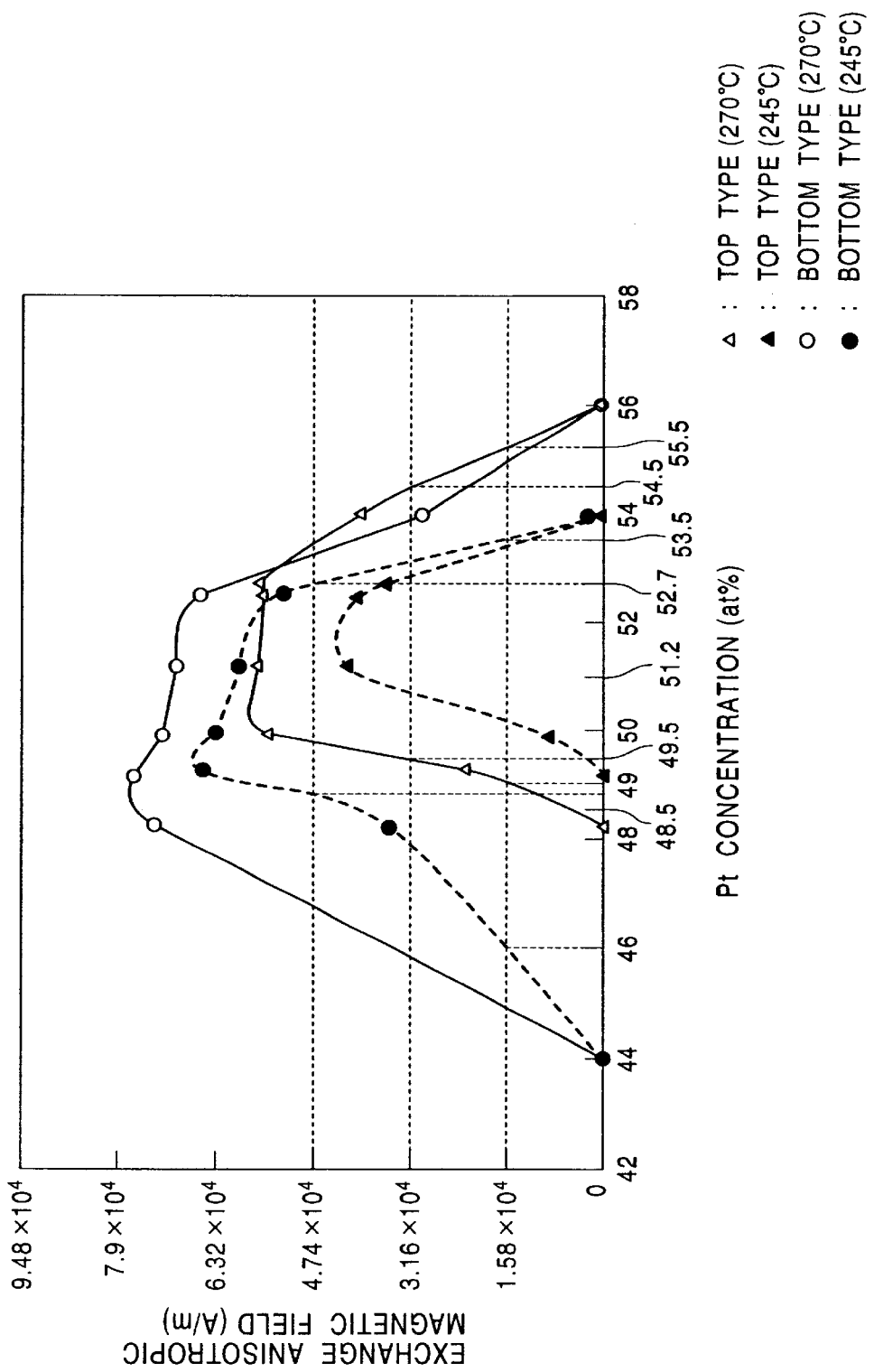
FIG. 13 is a graph illustrating the relation between the Pt concentration (at %) and exchange coupling magnetic field in the PtMn alloy according to the invention.

The method for manufacturing the spin-valve type thin film magnetic element according to the present invention takes advantage of the composition ratios of the antiferromagnetic layers of the bottom type spin-valve thin film magnetic element and top type spin-valve thin film magnetic element shown in FIG. 13.

This means that, in the spin-valve type thin film magnetic element according to the present invention as the bottom type spin-valve type thin film magnetic element, it is preferable that the composition range of the alloy to be used for the first antiferromagnetic layer is the same as that of the antiferromagnetic layer of the bottom type spin-valve type thin film magnetic element shown in FIG. 13, and the composition range of the alloy to be used for the second antiferromagnetic layer is the same as that of the antiferromagnetic layer of the top type spin-valve type thin film magnetic element shown in FIG. 13.

FIG. 13 clearly shows that the Pt composition ratio m is preferably in the range of about 46 at %≦m≦about 53.5 at %, when the antiferromagnetic layer of the bottom type spin-valve type thin film magnetic element is formed of an alloy comprising $X_mMn_{100-m}$, (where X is at least one element from the group Pt, Pd, Ir, Rh, Ru and Os).

It is preferred that m not be less than about 46 at % nor more than about 53.5 at %, since the exchange coupling magnetic field becomes about $1.58 \times 10^4$ A/m or less, even when applying the first heat treatment at a heat treatment temperature of about 245° C. This is because the crystal lattice of the X-Mn alloy is not completely converted into a L10 type ordered lattice and will fail to exhibit antiferromagnetic properties, or a uniaxial exchange coupling magnetic field will not be displayed.

An exchange coupling magnetic field of about $3.16 \times 10^4$ A/m or more may be obtained by the heat treatment at a second heat treatment temperature of about 270° C. in the composition range as described above.

The more preferable composition range m of the X-Mn alloy is about 48.5 at % to about 52.7 at %, since an exchange coupling magnetic field of about $4.74 \times 10^4$ A/m may be obtained by applying the first heat treatment at a heat treatment temperature of about 245° C.

It is also preferable that m and n representing the composition ratio are in the ranges of about 46 at %≦m+ n≦about 53.5 at % and about 0.2 at %≦n≦about 40, when the antiferromagnetic layer of the bottom type spin-valve type thin film magnetic element is formed of an alloy comprising $Pt_mMn_{100-m-n}Z_n$, where Z is at least one element from the group of Pd, Ir, Rh, Ru and Os, since an exchange coupling magnetic field of about $1.58 \times 10^4$ A/m or more can be obtained by applying a heat treatment at a heat treatment temperature of about 245° C. A more preferable range of m+n is about 48.5 at % to about 52.7 at % or less.

It is preferred that the range of n not be of less than about 0.2 at % since the effect for enhancing ordering of the crystal lattice of the antiferromagnetic layer, or the effect for increasing the exchange coupling magnetic field, is not fully manifested. It is also preferred that the range of n not exceed about 40 at % since the exchange coupling magnetic field decreases.

In one embodiment, the antiferromagnetic layer of the bottom type spin-valve type thin film magnetic element comprises an alloy represented by $Pt_qMn_{100-q-j}L_j$, where L is at least one element from the group of Au, Ag, Cr, Ni, Ne, Ar, Xe and Kr. The subscripts q and j represent the composition ratio and are preferably in the range of about 46 at %≦q+j≦about 53.5 at % and about 0.2 at %≦j≦about 10 at %.

It is preferred that the range of q+j not be less than about 46 at % nor greater than about 53.5 at % since the exchange coupling magnetic field reduces to about $1.58 \times 10^4$ A/m. A more preferable range of q+j is about 48.5 at % to about 52.7 at %.

It is also preferred that the ratio j not be less than about 0.2 at % since the effect for improving the uniaxial exchange coupling magnetic field is not fully manifested by adding the element L. It is also preferred that the ratio j not exceed about 10 at % because the uniaxial exchange coupling magnetic field reduces.

FIG. 13 clearly shows that the preferable composition ratio m is in the range of about 49 at %≦m≦about 55.5 at %, when the antiferromagnetic layer of the top type spin-valve thin film magnetic element comprises an alloy represented by $X_mMn_{100-m}$, where X is at least one element from the group Pt, Pd, Ir, Rh, Ru and Os.

It is also preferred that the range of m not be less than about 49 at % nor more than to about 55.5 at %, since the exchange coupling magnetic field becomes about $1.58 \times 10^4$ A/m or less, even when applying the second heat treatment at a heat treatment temperature of about 270° C. This is because the crystal lattice of the X-Mn alloy is not completely converted into a L10 ordered lattice and will fail to exhibit antiferromagnetic properties or uniaxial exchange coupling magnetic field.

It is apparent that the exchange coupling magnetic field of the antiferromagnetic layer of the bottom type element is low in any composition ratio after heat treating at a temperature of about 245° C. This means that the exchange coupling magnetic field of the antiferromagnetic layer of the bottom type element can be larger than the exchange coupling magnetic field of the antiferromagnetic layer of the top type element in the range of the composition ratio as described above even after applying the first heat treatment.

The preferable range of the subscript m is about 49.5 at % to about 54.5 at %, because an exchange coupling magnetic field of about $3.16 \times 10^4$ A/m or more can be obtained by applying a heat treatment at about 270° C. The exchange coupling magnetic field of the antiferromagnetic layer of the bottom type element can be made larger than the exchange coupling magnetic field of the antiferromagnetic layer of the top type element by applying a heat treatment at about 245° C.

In another embodiment, the antiferromagnetic layer of the top type spin-valve type thin film magnetic element is represented by $Pt_mMn_{100-m-n}Z_n$, where Z is at least one element from the group of Pd, Ir, Rh, Ru and Os. The subscripts m and n represent the composition ratios and are preferably in the range of about 49 at %≦m+n≦55.5 at % and about 0.2 at %≦n≦about 40 at %.

It is preferred that about the range of m+N not be less than about 49 at % nor more than 55.5 at % since the exchange coupling magnetic field is reduced to about $1.58 \times 10^4$ A/m. The preferable range of m+n is about 49.5 at % to about 54.5 at %.

It is also preferred that n not be less than about 0.2 at % since enhancing the ordering of the crystal lattice of the antiferromagnetic layer, or increasing the exchange coupling magnetic field, is not fully manifested. It is preferred that the range of n not exceed about 40 at % since the exchange coupling magnetic field reduces.

In yet another embodiment, the antiferromagnetic layer of the top type spin-valve type thin film magnetic element is represented by $Pt_qMn_{10-q-j}L_j$, where L is at least one element from the group of Au, Ag, Cr. Ni, Ne, Ar, Xe and Kr. The subscripts q and j represent the composition ratio and are preferably in the ranges of about 49 at %≦q+j≦about 55.5 at % and about 0.2 at %≦j≦about 10 at %.

It is preferred that the range of q+j not be less than about 49 at % nor more than about 55.5 at % since the exchange coupling magnetic field is reduced to about $1.58 \times 10^4$ A/m or less, even when applying the second heat treatment at a heat treatment temperature of about 270° C. The preferable range of q+j is about 49.5 at % to about 54.4 at %.

It is also preferred that the range of j not be less than about 0.2 at % since the effect for improving the uniaxial exchange coupling magnetic field is not fully displayed. It is preferred that the range of j not exceed about 10 at % since the uniaxial exchange coupling magnetic field-drops.

In another embodiment, the composition of the first antiferromagnetic layer may be the same as the composition of the second antiferromagnetic layer. The first and second antiferromagnetic layers are formed of an alloy comprising $X_mMn_{100-m}$, where X is at least one element from the group of Pt, Pd, Ir, Rh, Ru and Os. The subscript m represents the composition ratio is preferably in the range of about 49 at %≦m≦about 53.5 at %.

The exchange coupling magnetic field of the first antiferromagnetic layer is adjusted to about $1.58 \times 10^4$ A/m or more by applying the first heat treatment at a heat treatment temperature of about 245° C., and the exchange coupling magnetic field of the first antiferromagnetic layer is larger than the exchange coupling magnetic field of the second antiferromagnetic layer, when the second antiferromagnetic layer has the composition as described above.

The exchange coupling magnetic field of the second antiferromagnetic layer may be adjusted to about $1.58 \times 10^4$ A/m or more by applying the second heat treatment at a heat treatment temperature of about 270° C.

In the $X_mMn_{100-m}$ alloy, the preferable composition range of m is about 49.5 at % to about 52.7 at % or. The most preferable upper limit of m is about 51.2 at % or less, since the exchange coupling magnetic field of the first antiferromagnetic layer may be increased by heat treatment at about 245° C. The difference of the exchange coupling magnetic fields between the first and second antiferromagnetic layers may be made large to enable the directions of magnetization of the pinned magnetic layer and free magnetic layer to be readily controlled.

In another embodiment, the first and second antiferromagnetic layers are represented by $Pt_mMn_{100-m-n}Z_n$, where Z is at least one element from the group of Pd, Ir, Rh, Ru and Os. The subscripts m and n represent the composition ratio and are preferably in the ranges of about 49 at %$\leq$m+n$\leq$about 53.5 at % and about 0.2 at %$\leq$n$\leq$about 40 at %. The more preferable composition range is represented by m of about 49.5 at % to about 52.7 at %. The most preferable upper limit of m is about 51.2 at % or less.

It is preferred that the range of n not be less than about 0.2 at % since the effect for improving the uniaxial exchange coupling magnetic field is not fully manifested by adding the element Z. It is also preferred that n not exceed about 40 at % since the uniaxial exchange coupling magnetic field drops.

In another embodiment the first and second antiferromagnetic layers are represented by $Pt_qMn_{100-q-j}L_j$, where L is at least one element from the group of Au, Ag, Cr, Ni, Ne, Ar, Xe and Kr. The subscripts q and j represent the composition ratio and are preferably in the ranges of about 49 at %$\leq$q+j$\leq$about 53.5 at % and about 0.2 at %$\leq$j$\leq$about 10 at %. The preferable composition range is represented by m of about 49.5 at % to about 52.7 at %. The most preferable upper limit of m is about 51.2 at % or less.

It is preferred that the range of j not be less than about 0.2 at % since the effect for improving the uniaxial exchange coupling magnetic field is not fully displayed by adding the element L. It is also preferred that j not exceed about 10 at % since the uniaxial exchange coupling magnetic field decreases.

When the composition of the first antiferromagnetic layer of the bottom type spin-valve thin film magnetic element is different from the composition of the second antiferromagnetic layer of the bottom type spin-valve thin film magnetic element within the composition range described above, for example the Mn concentration of the first antiferromagnetic layer is adjusted to be higher than the Mn concentration of the second antiferromagnetic layer, the difference between the exchange coupling magnetic fields after the first heat treatment becomes more evident, thereby enabling the direction of magnetization of the free magnetic layer to be more perpendicular to the direction of magnetization of the pinned magnetic layer after the second heat treatment. Consequently, the degree of design freedom may be improved by selecting various combinations for making the difference of the exchange coupling magnetic fields larger.

As has been described using FIG. 12, the first heat treatment temperature is preferably about 220° C. to about 245° C.

This temperature range permits the exchange coupling magnetic field of the first antiferromagnetic layer 21 to be about $1.58 \times 10^4$ A/m and, more preferably, an exchange coupling magnetic field of as high as about $4.74 \times 10^4$ A/m may be obtained at a heat treatment temperature of about 230° C. or more.

On the other hand, the exchange coupling magnetic field of the second antiferromagnetic layer 31 is made to be smaller than the exchange coupling magnetic field of the first antiferromagnetic layer.

Subsequently, the second heat treatment is applied. The second heat treatment is applied at a higher temperature than the first heat treatment temperature while applying a second magnetic field in the direction (the track width direction) perpendicular to the first magnetic field in this step. The magnitude of the second magnetic field applied is adjusted to be larger than the exchange coupling magnetic field of the second antiferromagnetic layer 31 in the first heat treatment step, and smaller than the exchange coupling magnetic field of the first antiferromagnetic layer 21 in the first heat treatment step.

It is preferable in the present invention that the second heat treatment temperature is adjusted to be about 250 to about 270° C.

The temperature range above permits the exchange coupling magnetic field of the second antiferromagnetic layer 31 to be larger than about $3.16 \times 10^4$ A/m, which is larger than the exchange coupling magnetic field generated in the foregoing first heat treatment step. In addition, magnetization of the free magnetic layer 24 is stabilized due to its ferrimagnetic state, and magnetization of the first free magnetic layer 28 is reversed and is aligned in the X-direction by the RKKY interaction when the magnetization of the second free magnetic layer 30 is directed in the track width direction (reversed direction to the X-direction) by the exchange coupling magnetic field.

The exchange coupling magnetic field of the first antiferromagnetic layer 21 is not degraded by applying the second magnetic field to the first antiferromagnetic layer 21, by making the second applied magnetic field to be smaller than the exchange coupling magnetic field of the first antiferromagnetic layer 21 generated in the first heat treatment step, thereby enabling magnetization of the pinned magnetic layer 22 to remain fixed in the height direction. Since the pinned magnetic layer 22 takes a ferrimagnetic structure, its magnetization is stabilized so as to put the directions of magnetization of the first pinned magnetic layer 25 and second pinned magnetic layer 27 in an antiparallel relation with each other.

Properly adjusting the temperatures of the two heat treatment steps, and the magnitude and direction of the applied magnetic field, enables the direction of magnetization of the pinned magnetic layer 22 and the direction of magnetization of the free magnetic layer 24 to be properly and easily adjusted so as to intersect with each other.

Since the magnitudes of the first antiferromagnetic layer 21 and second antiferromagnetic layer 31 are largely influenced by the composition ratio of each layer, it is preferable to adjust the composition ratios in depositing the first antiferromagnetic layer 21 and second antiferromagnetic layer 31.

The composition ratio has been already described in FIG. 13. The subscript m indicates the composition ratio and is preferably in the range of about 46 at %$\leq$m$\leq$about 53.5 at % when the first antiferromagnetic layer 21 is formed of an alloy comprising $X_mMn_{100-m}$, where X is at least one of the element among Pt, Pd, Ir, Rh, Ru and Os. The more preferable composition range is represented by m in the range of about 48.5 at % to about 52.7 at %.

In another embodiment, the first antiferromagnetic layer 21 comprises $Pt_mMn_{100-m-n}Z_n$, where Z is at least one element from the group of Pd, Ir, Rh, Ru and Os. The subscripts m and n represent the composition ratios are preferably in the ranges of about 46 at %$\leq$m+n$\leq$about 53.5 at % and about 0.2 at %$\leq$n$\leq$about 40 at %. More preferable composition range is represented by m+n of about 48.5 at % to about 52.7 at %.

In another embodiment, the antiferromagnetic layer 21 comprises $Pt_qMn_{100-q-j}L_j$, where L is at least one element selected from Au, Ag, Cr, Ni, Ne, Ar, Xe and Kr. The subscripts q and j represent the composition ratio and are preferably in the ranges of about 46 at %$\leq$q+j$\leq$about 53.5 at % and 0.2 at %$\leq$j$\leq$about 10 at %. The more preferable composition range is about 48.5 at % to about 52.7 at %.

In yet another embodiment, the second antiferromagnetic layer 31 comprises $X_m Mn_{100-m}$, where X is at least one element among Pt, Pd, Ir, Rh, Ru and Os). The subscript m represents the composition ratio and is preferably in the range of about 49 at %≦m≦about 55.5 at %. The more preferable range of m is about 49.5 at % or to about 54.5 at %.

In a further embodiment, the antiferromagnetic layer 31 comprises $Pt_m Mn_{100-m-n} Z_n$, where Z is at least one element among Pd, Ir, Rh, Ru and Os. The subscripts m and n represent the composition ratio and are preferably in the ranges of about 49 at %≦m+n≦about 55.5 at % and about 0.2 at %≦n≦about 40 at %. The ratio m+n is more preferably about 49.5 at % to about 54.5 at %.

In a still further embodiment, the second antiferromagnetic layer 31 comprises $Pt_q Mn_{100-q-j} L_j$, where L is at least one element from the group of Au, Ag, Cr, Ni, Ne, Ar, Xe and Kr. The subscripts q and j indicate the composition ratio and are preferably within the ranges of about 49 at %≦q+j≦about 55.5 at % and about 0.2 at %≦j≦about 10 at %. The more preferable range of q+j is about 49.5 at % to about 54.5 at %.

Both the first antiferromagnetic layer 21 and second antiferromagnetic layer 31 may have the same composition in the present invention. Such composition ratio is preferably represented as follows.

In one embodiment, the first antiferromagnetic layer 21 and second antiferromagnetic layer 31 are formed of an alloy represented by $X_m Mn_{100-m}$, where X is at least one element among Pt, Pd, Ir, Rh, Ru and Os. The subscript m represents the composition ratios of the first antiferromagnetic layer 21 and second antiferromagnetic layer 31 and is preferably in the range of about 49 at %≦m≦about 53.5 at %. The more preferable composition range of m is about 49.5 at % and to about 52.7 at %. The most preferable upper limit is about 51.2 at % or less.

In another embodiment, the first antiferromagnetic layer 21 and second antiferromagnetic layer 31 comprise $Pt_m Mn_{100-m-n} Z_n$, where Z is at least one element from the group of Pd, Ir, Rh, Ru and Os. The subscripts m and n represent the composition ratio and are preferably in the ranges of about 49 at %≦m+n≦about 53.5 at % and about 0.2 at %≦n≦about 40 at %. The composition ratio m+n is more preferably about 49.5 at % to about 52.7 at %. The most preferable upper limit is about 51.2 at % or less.

In yet another embodiment, the first antiferromagnetic layer 21 and second antiferromagnetic layer 31 comprise $Pt_q Mn_{100-q-j} L_j$, where L is at least one element from the group of Au, Ag, Cr, Ni, Ne, Ar, Xe and Kr. The subscripts q and j indicate the composition ratio and are preferably within the ranges of about 49 at %≦q+j≦about 53.5 at % and about 0.2 at %≦j≦about 10 at %. The more preferable composition range of q+j is about 49.5 at % to about 52.7 at %. The most preferable upper limit is about 51.5 at % or less.

When the composition of the first antiferromagnetic layer 21 is made to be different from the composition of the second antiferromagnetic layer 31, for example the Mn concentration of the first antiferromagnetic layer 21 is adjusted to be higher than the Mn concentration of the second antiferromagnetic layer 31, the difference between the exchange coupling magnetic fields after the first heat treatment becomes more evident. This enables the direction of magnetization of the free magnetic layer 24 to be more perpendicular to the direction of magnetization of the pinned magnetic layer 22 after the second heat treatment. Consequently, the degree of design freedom may be improved by selecting various combinations for making the difference of the exchange coupling magnetic fields larger.

The exchange coupling magnetic field of the first antiferromagnetic layer 21 may be increased by applying the first heat treatment within the composition range described above, and the exchange coupling magnetic field of the first antiferromagnetic layer 21 becomes larger than the exchange coupling magnetic field of the second antiferromagnetic layer 31. Furthermore, the exchange coupling magnetic field of the second antiferromagnetic layer 31 may become larger than the foregoing exchange coupling magnetic field by applying the second heat treatment.

Consequently, the direction of magnetization of the pinned magnetic layer 22 may be properly perpendicular to the direction of magnetization of the free magnetic layer 24.

Figure 6:
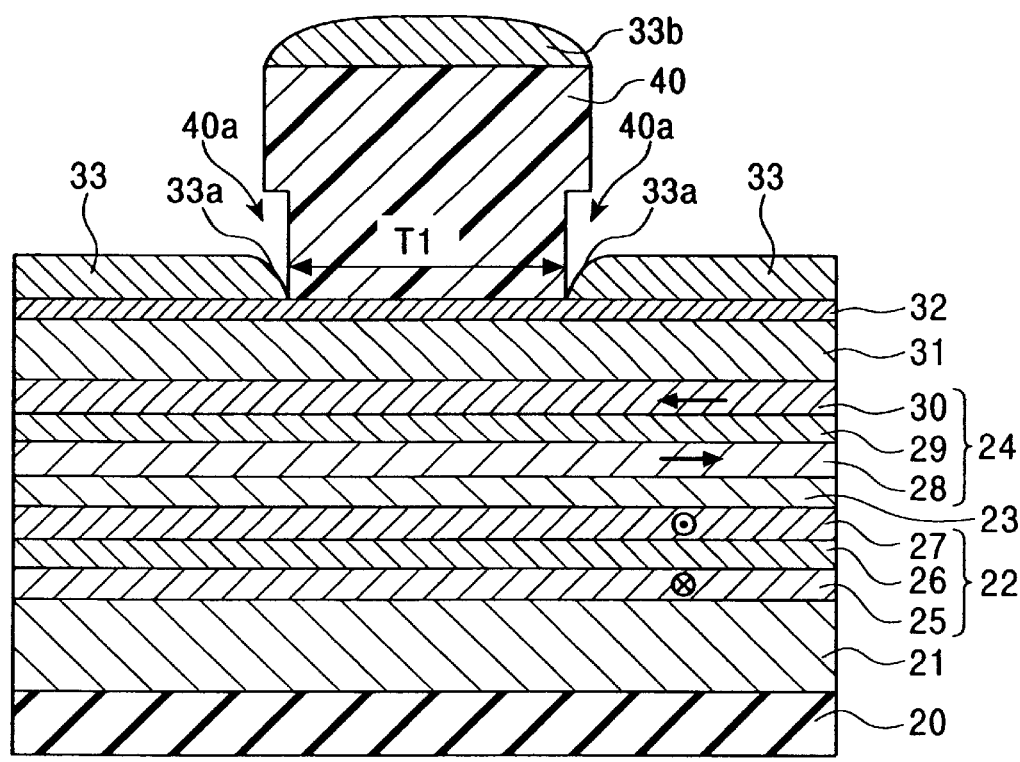
FIG. 6 illustrates a manufacturing step following the step in FIG. 5.

A lift-off resist layer 40 is formed on the protective layer 32 as shown in FIG. 6 in the present invention. The track width Tw is influenced by variation of the width T1 of the lower face of the resist layer 40. Accordingly, it is preferable to form the width T1 as narrow as possible to narrow the track width in compliance with high density recording expected in near future.

Cu-off portions 40a and 40a are formed in the resist layer 40 at the right and left sides of the track width. Accordingly, each inner tip portion 33a of the electrode layer 33 is formed under the cut-off portion 40a, when the electrode 33 is deposited by sputtering on each of the protective layers 32 at both sides of the resist layer 40. The inner tip portion 33a of the electrode 33 is formed as an inclined face or a curved face by a shadowing effect. An electrode layer 33b is also deposited by sputtering on the resist layer 40, which is subsequently removed.

Figure 7:
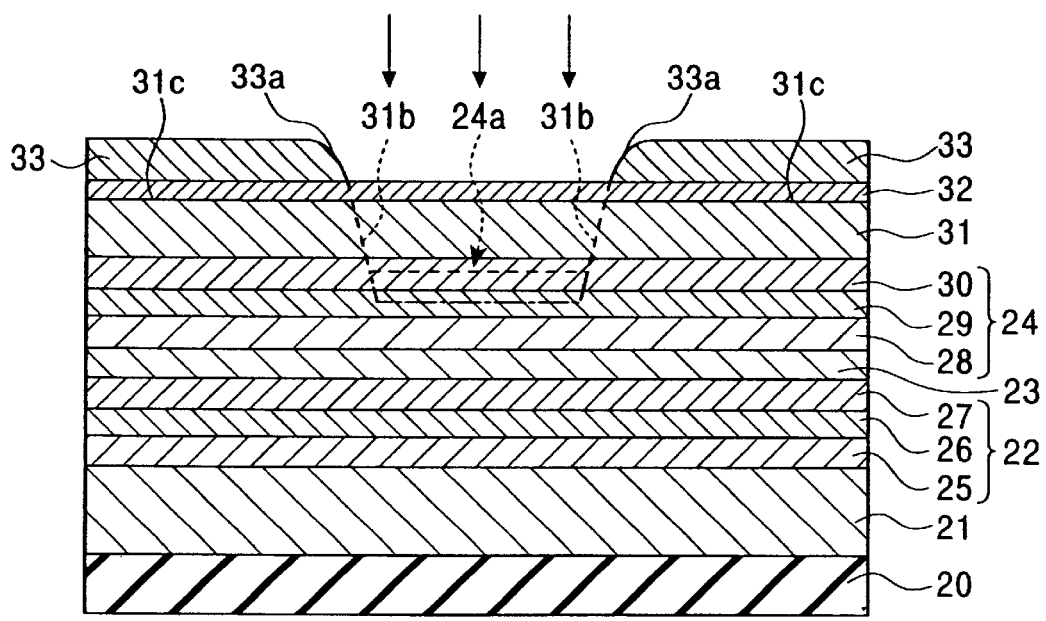
FIG. 7 illustrates a manufacturing step following the step in FIG. 6.

The spin-valve type thin film magnetic element is formed as shown in FIG. 7 by the process described above. Then, the protective layer 32 exposed within a width T1, and the second antiferromagnetic layer 31 and a portion of the first free magnetic layer 30, both located under the width T1, are removed using the electrode layers 33 separated by the width T1, as a mask. The depth of removal is shown by a dotted line in FIG. 7. The spin-valve type thin film magnetic element, as shown in FIG. 1, is completed by the foregoing process.

The first free magnetic layer 30 within the width T1 is completely removed, and a part of the non-magnetic intermediate layer 29 within the range of the width T1 is also removed by an anisotropic etching such as RIE. The depth of removal is shown by a dotted broken line in the drawing. The spin-valve type thin film magnetic element as shown in FIG. 2 is completed by this process.

The layers from the first antiferromagnetic layer 21 through the second antiferromagnetic layer 31 are continuously deposited in the present invention, and the portion of second antiferromagnetic layer 31 between the electrode layers 33 are removed using the electrode layers 33 formed by taking advantage of the lift-off resist layer 40 as masks. As a result, the tip portion 31a of the remaining second antiferromagnetic layer 31 is substantially untapered as in conventional examples. Thus, a sufficient exchange coupling magnetic field is generated between the tip portion 31a and the second free magnetic layer 30 formed under the tip portion to enable the free magnetic layer 28 to be properly put into a single magnetic domain state.

Since the surface of the inner tip portion 33a of the electrode layer 33 is inclined or curved, the inner tip face 31b of the second antiferromagnetic layer 31 formed under it is also readily inclined following the curved surface of the tip portion. However, this inclined surface can be formed to be almost vertical (in the Z-direction) by using the anisotropic etching method, thereby enabling the tip portion 31*b* of the second antiferromagnetic layer 31 to be substantially untapered.

The manufacturing method described above also permits the track width Tw to be accurately determined depending on the width of the groove 24*a*.

Accordingly, a spin-valve type thin film magnetic element having an excellent sensitivity, in which the magnetic moment of the second free magnetic layer 30 can be smoothly rotated against the very weak leak magnetic field from the magnetic recording medium, can be manufactured the second antiferromagnetic layer 31 at the center of the element.

The electrode layers 33 are formed only on the flattened surface 31*c* of the second antiferromagnetic layer 31.

Figure 8:
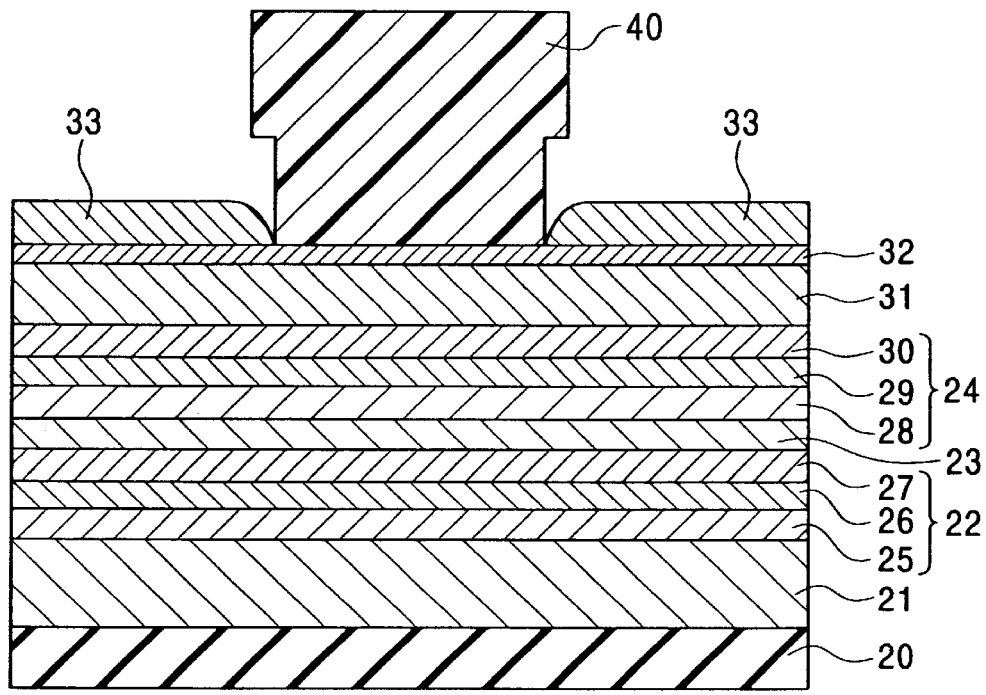
FIG. 8 illustrates a manufacturing step in accordance with another method for manufacturing the magnetic field sensing element according to the present invention.
Figure 9:
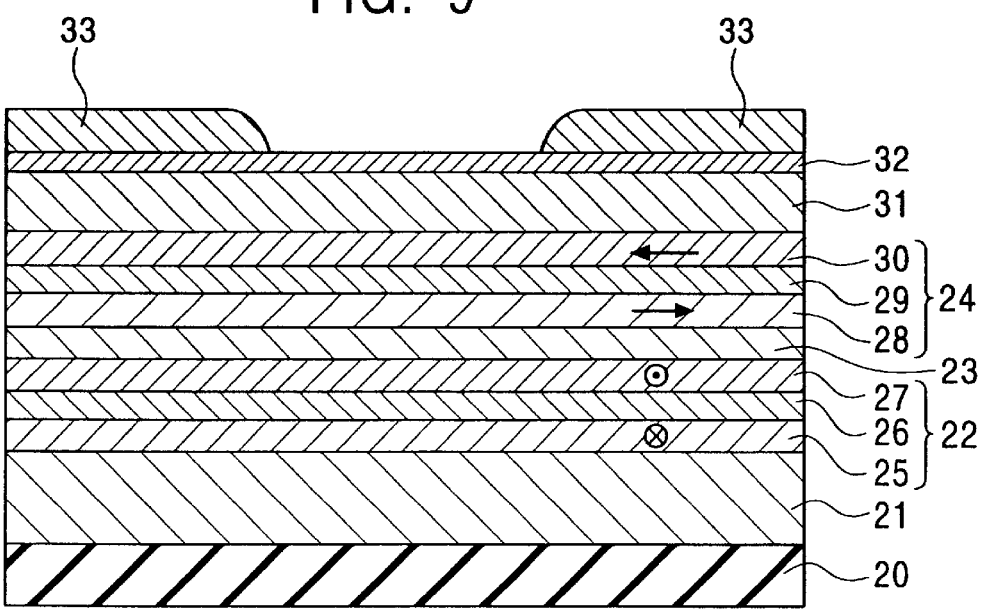
FIG. 9 illustrates a manufacturing step following the step in FIG. 8.

FIGS. 8 and 9 illustrate manufacturing steps in the accordance with another method of the present invention. In FIG. 8, after laminating the layers from the first antiferromagnetic layer 21 through the protective layer 32, the electrode layers 33 are deposited by sputtering using the lift-off resist layer 40. After removing the resist layer 40, exchange coupling magnetic fields are generated in the first antiferromagnetic layer 21 and second antiferromagnetic layer 31 by applying two heat treatments as previously described, thereby putting magnetization of the pinned magnetic layer 22 and magnetization of the free magnetic layer 24 to be perpendicular with each other.

The etching process shown in FIG. 7 is applied using the electrode layers 33 as a mask. This manufacturing method avoids tapering the tip portion 31*a* of the second antiferromagnetic layer 31.

Finally, the action of a sense magnetic field of the spin-valve type thin film magnetic element according to the present invention will be described.

The second pinned magnetic layer 27 is formed under the non-magnetic layer 23 in the spin-valve type thin film magnetic element shown in FIG. 1. The direction of the sense current magnetic field is aligned with the direction of magnetization of the pinned magnetic layer having the larger magnetic moment in either the first pinned magnetic layer 25 or the second pinned magnetic layer 27.

In one example, the magnetic moment per unit area of the second pinned magnetic layer 27 is larger then the magnetic moment per unit area of the first pinned magnetic layer 25, and the magnetic moment per unit area of the second pinned magnetic layer 27 is directed in the opposite direction (in the left direction) to the Y-direction. Then, the synthesized magnetic moment, as a sum of the magnetic moment per unit area of the first pinned magnetic layer 25 and the magnetic moment per unit area of the second pinned magnetic layer 27, is directed in the opposite direction (the left direction) to the Y-direction.

When the sense current flowing around the center of the non-magnetic layer 23 is allowed to flow from the right side to the left side, the sense current magnetic field formed by the current is directed in the opposite direction (the direction toward the opposed face to the recording medium) to the Y-direction under the non-magnetic layer 23. Consequently, the direction of the synthesized magnetic moment per unit area of the pinned magnetic layer 22 can be aligned with the direction of the sense current magnetic field.

Consequently, the exchange coupling magnetic field, acting between the first pinned magnetic layer 25 and second pinned magnetic layer 27 (the RKKY interaction), may be amplified to enable an antiparallel state of magnetization of the first pinned magnetic layer 25 and the second pinned magnetic layer 27 to be more thermally stable.

It has been made clear that a sense current magnetic field of about $2.37 \times 10^3$ A/m is generated by flowing about 1 mA of the sense current, and the temperature of the element increases by about 10° C. In addition, the rotational speed of the recording medium is increased to about 10000 rpm, which causes a maximum temperature increase of about 100° C. in the device. The temperature of the element is further increased to about 200° C. by flowing about 10 mA of a sense current, besides increasing the sense current magnetic field to about $2.37 \times 10^4$ A/m.

In the case when the environmental temperature is very high and a large sense current is allowed to flow, the antiparallel relation between magnetization of the first pinned magnetic layer 25 and second pinned magnetic layer 27 would be readily broken when the direction of the synthesized magnetic moment per unit area, which is determined by a sum of the magnetic moment per unit area of the first pinned magnetic layer 25 and the magnetic moment per unit area of the second pinned magnetic layer 27, and the direction of the sense current magnetic field are opposed with each other.

For making the element durable under a high environmental temperature, an antiferromagnetic material having a high blocking temperature should be used for the first antiferromagnetic layer 21, in addition to adjusting the direction of the sense current magnetic field. Accordingly, the alloys having high blocking temperatures as described above are used in the present invention.

Although the sense current magnetic field is increased in accordance with increased reproduction output signals obtained by increasing the magnitude of the sense current to comply with high density recording, magnetization states of the first and second pinned magnetic layers are stabilized by increasing the sense current magnetic field, since the sense current magnetic field amplifies the exchange coupling magnetic field acting between the first and second pinned magnetic layers in the embodiments of the present invention.

However, magnetization of the pinned magnetic layer may be thermally stabilized by allowing the direction of the sense current magnetic field formed by flowing the sense current to align with the direction of magnetization of the pinned magnetic layer. This occurs even in the single spin-valve type thin film magnetic element in which the pinned magnetic layer comprises a monolayer.

The magnetic field sensing element according to the present invention can be utilized in a thin film magnetic head for use in the hard disk device and as a magnetic sensor.

According to the method for manufacturing the magnetic field sensing element described in the present invention, layers from the first antiferromagnetic layer through the second antiferromagnetic layer are continuously deposited in the bottom type spin-valve thin film magnetic element without allowing the surface of each layer to contact air. Therefore, it is not necessary to clean the surface of each layer by ion-milling or inverse sputtering. Also, the manufacturing method is excellent in reproducibility. Since the need of cleaning the surface of each layer by ion-milling or inverse sputtering is eliminated, the manufacturing method also turns out to be excellent by avoiding defects arising from the cleaning process, such as contamination by re-adsorption or adverse effects on generation of the exchange coupling magnetic field due to distortion of the surface crystallinity.

According to the manufacturing method of the present invention, the layers from the second antiferromagnetic layer exposed between the electrode layers through a part of the second free magnetic layer in the ferrimagnetic free magnetic layers are removed by etching using a pair of the electrode layers formed on the second antiferromagnetic layer as masks. Consequently, the tip portions of the remaining second antiferromagnetic layers are substantially untapered in contrast to the conventional examples. This enables the tip portions to be thick. Therefore, a large exchange coupling magnetic field is generated between the second free magnetic layer and second antiferromagnetic layer.

In addition, since the free magnetic layer has a ferrimagnetic structure, magnetization of the first free magnetic layer that substantially contributes to magnetoresistance can be stabilized. Also, the first free magnetic layer can be properly put in a single magnetic domain state, and Barkhausen noise are properly suppressed. Accordingly, a magnetic field sensing element that is able to suppress side-reading can be manufactured.

The direction of magnetization of the pinned magnetic layer in contact with the first antiferromagnetic layer is allowed to easily and properly intersect the direction of magnetization of the free magnetic layer in contact with the second antiferromagnetic layer by properly adjusting the heat treatment temperature and the direction and magnitude of the applied magnetic field. Therefore, a magnetic field sensing element is realized having stable magnetoresistive effect.

What is claimed is:

1. A method for manufacturing a magnetic field sensing element comprising the steps of:
   (a) forming a laminate by sequentially laminating a first antiferromagnetic layer, a pinned magnetic layer, a non-magnetic layer, a free magnetic layer comprising a first free magnetic layer, a non-magnetic intermediate layer and a second free-magnetic layer, and a second antiferromagnetic layer;
   (b) generating an exchange coupling magnetic field in the first and second antiferromagnetic layers by applying a heat treatment at a first heat treatment temperature, while applying a first magnetic field to the laminate in a perpendicular direction with respect to a track width direction, thereby fixing a direction of magnetization of the pinned magnetic layer and a direction of magnetization of the free magnetic layer in said perpendicular direction, wherein the exchange coupling magnetic field of the first antiferromagnetic layer is larger than the exchange coupling magnetic field in the second antiferromagnetic layer;
   (c) heat treating at a second heat treatment temperature that is higher than the first heat treatment temperature while applying a second magnetic field that is larger than the exchange coupling magnetic field of the second antiferromagnetic layer and smaller than the exchange coupling magnetic field of the first antiferromagnetic layer in the track width direction, thereby endowing the free magnetic layer with a longitudinal bias magnetic field in a direction that intersects the direction of magnetization of the pinned magnetic layer;
   (d) forming a pair of electrode layers on the laminate separated by a predetermined distance; and
   (e) removing a portion of the laminate exposed between the pair of the electrodes to a depth about midway into the second free magnetic layer.

2. A method for manufacturing the magnetic field sensing element according to claim 1, wherein the pair of electrode layers are formed on the second antiferromagnetic layer in the step (a), and step (e) is performed following step (c).

3. A method for manufacturing the magnetic field sensing element according to claim 1, wherein the pair of electrode layers are formed using a lift-off resist layer.

4. A method for manufacturing the magnetic field sensing element according to claim 1, further comprising removing the laminate a depth of about midway into the non-magnetic intermediate layer.

5. A method for manufacturing the magnetic field sensing element according to claim 1, wherein the first antiferromagnetic layer and the second antiferromagnetic layer comprise an antiferromagnetic material including Mn and at least one element selected from the group consisting of Pt, Pd, Rh, Ru, Ir, Os, Au, Ag, Cr, Ni, Ne, Ar, Xe and Kr.

6. A method for manufacturing the magnetic field sensing element according to claim 1, wherein at least one of the first free magnetic layer and second free magnetic layer is formed of a magnetic material represented by a composition formula of CoFeNi and comprising about 9 at % to about 17 at % of Fe, and about 0.5 at % to about 10 at % of Ni and a balance of Co.

7. A method for manufacturing the magnetic field sensing element according to claim 6, wherein both the first free magnetic layer and the second free magnetic layer are formed of the CoFeNi alloy.

8. A method for manufacturing the magnetic field sensing element according to claim 1, further comprising forming an intermediate layer comprising one of a CoFe alloy or Co between the non-magnetic layer and first free magnetic layer.

9. A method for manufacturing the magnetic field sensing element according to claim 8, wherein at least one of the first free magnetic layer and the second free magnetic layer is formed of a magnetic material represented by a composition formula of CoFeNi and comprising about 7 at % to about 15 at % of Fe, and about 5 at % to about 15 at % of Ni and a balance of Co.

10. A method for manufacturing the magnetic field sensing element according to claim 1, wherein the first heat treatment temperature is about 220° C. to about 245° C.

11. A method for manufacturing the magnetic field sensing element according to claim 1, wherein the second heat treatment temperature is about 250° C. to about 270° C.

* * * * *

UNITED STATES PATENT AND TRADEMARK OFFICE
CERTIFICATE OF CORRECTION

PATENT NO. : 6,757,962 B2
DATED : July 6, 2004
INVENTOR(S) : Naoya Hasegawa et al.

It is certified that error appears in the above-identified patent and that said Letters Patent is hereby corrected as shown below:

Column 34,
Line 21, after "the laminate" insert -- to --.

Signed and Sealed this

Twenty-eighth Day of December, 2004

JON W. DUDAS
*Director of the United States Patent and Trademark Office*